(12) United States Patent
Ushida et al.

(10) Patent No.: US 9,916,976 B2
(45) Date of Patent: Mar. 13, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takuro Ushida, Toyama (JP); Tsukasa Kamakura, Toyama (JP); Hiroshi Ashihara, Toyama (JP); Kimihiko Nakatani, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/267,390

(22) Filed: Sep. 16, 2016

(65) Prior Publication Data

US 2017/0004961 A1 Jan. 5, 2017

Related U.S. Application Data

(63) Continuation of application No. PCT/JP2014/057388, filed on Mar. 18, 2014.

(51) Int. Cl.
*H01L 21/02* (2006.01)
*C23C 16/40* (2006.01)
(Continued)

(52) U.S. Cl.
CPC ........ *H01L 21/0228* (2013.01); *C23C 16/405* (2013.01); *C23C 16/4408* (2013.01);
(Continued)

(58) Field of Classification Search
CPC .................. H01L 21/0228; H01L 21/02186
See application file for complete search history.

(56) References Cited

U.S. PATENT DOCUMENTS

| 2005/0136657 A1 | 6/2005 | Yokoi et al. |
| 2008/0286981 A1 | 11/2008 | Hasper |

(Continued)

FOREIGN PATENT DOCUMENTS

| JP | 2004-023042 A | 1/2004 |
| JP | 2004-096060 A | 3/2004 |

(Continued)

OTHER PUBLICATIONS

English Translation of JP 2004023042 "Semiconductor Device and its Manufacturing Process", Jan. 22, 2004.*

(Continued)

*Primary Examiner* — Amar Movva
(74) *Attorney, Agent, or Firm* — Volpe and Koenig, P.C.

(57) ABSTRACT

An oxide film is formed on a substrate by performing a cycle a predetermined number of times. The cycle includes: continuously performing supplying in advance an oxidant to a substrate in a process chamber and simultaneously supplying the oxidant and a precursor to the substrate in the process chamber, without having to purge an interior of the process chamber between the act of supplying in advance the oxidant and the act of simultaneously supplying the oxidant and the precursor; stopping the supply of the oxidant and the precursor to the substrate in the process chamber and purging the interior of the process chamber; and supplying the oxidant to the substrate in the purged process chamber.

12 Claims, 10 Drawing Sheets

(51) Int. Cl.
*C23C 16/44* (2006.01)
*C23C 16/455* (2006.01)
*C23C 16/52* (2006.01)

(52) U.S. Cl.
CPC ........ *C23C 16/45523* (2013.01); *C23C 16/52* (2013.01); *H01L 21/02186* (2013.01)

(56) References Cited

U.S. PATENT DOCUMENTS

2008/0317972 A1    12/2008  Hendriks et al.
2012/0031894 A1*   2/2012   Shigetomi ......... H01L 21/67103
                                                           219/494

FOREIGN PATENT DOCUMENTS

JP    2009-004786 A    1/2009
JP    2009-054988 A    3/2009
WO    2007/043709 A1   4/2007

OTHER PUBLICATIONS

Aarik, Jaan et al., "Atomic layer growth of epitaxial TiO2 thin films from TiCl4 and H2O and a-Al2O3 substrates", May 1, 2002, Journal of Crystal Growth, pp. 189-198.*
International Search Report with English translation, PCT/JP2014/057388, dated Jul. 1, 2014, 3 pgs.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Continuation Application of PCT International Application No. PCT/JP2014/057388, filed Mar. 18, 2014, the entire content of which is hereby incorporated by reference.

TECHNICAL FIELD

The present disclosure relates to a method of manufacturing a semiconductor device, a substrate processing apparatus and a non-transitory computer-readable recording medium.

BACKGROUND

As an example of processes of manufacturing a semiconductor device, a process of supplying a precursor containing a metal element and an oxidant to a substrate and forming an oxide film containing a metal element on the substrate is often carried out.

The present disclosure provides a technique capable of enhancing the productivity of a film forming process and improving a film quality when an oxide film containing a metal element is formed on a substrate using a precursor and an oxidant.

SUMMARY

According to one embodiment of the present disclosure, there is provided a method of manufacturing a semiconductor device which includes forming an oxide film on a substrate by performing a cycle a predetermined number of times, the cycle including:
continuously performing supplying in advance an oxidant to a substrate in the process chamber and simultaneously supplying the oxidant and a precursor to the substrate in the process chamber, without having to purge an interior of the process chamber between the act of supplying in advance an oxidant and the act of simultaneously supplying the oxidant and a precursor;
stopping the supply of the oxidant and the precursor to the substrate in the process chamber and purging the interior of the process chamber; and
supplying the oxidant to the substrate in the purged process chamber.

According to another embodiment of the present disclosure, there is provided a substrate processing apparatus which includes:
a process chamber configured to accommodate a substrate;
a precursor supply system configured to supply a precursor into the process chamber;
an oxidant supply system configured to supply an oxidant into the process chamber;
a purge gas supply system configured to supply a purge gas into the process chamber; and
a control part configured to control the precursor supply system, the oxidant supply system and the purge gas supply system so as to perform forming an oxide film on a substrate by performing a cycle a predetermined number of times, the cycle including:
continuously performing supplying in advance an oxidant to the substrate in the process chamber and simultaneously supplying the oxidant and a precursor to the substrate in the process chamber, without having to purge an interior of the process chamber between the act of supplying in advance an oxidant and the act of simultaneously supplying the oxidant and a precursor;
stopping the supply of the oxidant and the precursor to the substrate in the process chamber and supplying a purge gas into the process chamber to purge the interior of the process chamber; and
supplying the oxidant to the substrate in the purged process chamber.

According to a further embodiment of the present disclosure, there is provided a non-transitory computer-readable recording medium storing a program that causes a computer to perform forming an oxide film on a substrate by performing a cycle a predetermined number of times, the cycle including:
continuously performing supplying in advance an oxidant to the substrate in the process chamber and simultaneously supplying the oxidant and a precursor to the substrate in the process chamber, without having to purge an interior of the process chamber between the act of supplying in advance an oxidant and the act of simultaneously supplying the oxidant and a precursor;
stopping the supply of the oxidant and the precursor to the substrate in the process chamber and purging the interior of the process chamber; and
supplying the oxidant to the substrate in the purged process chamber.

According to the present disclosure, it is possible to enhance the productivity of a film forming process and improve film quality when an oxide film containing a metal element is formed on a substrate using a precursor and an oxidant.

DETAILED DESCRIPTION

One Embodiment

One embodiment of the present disclosure will now be described with reference to FIGS. 1 to 3.

(1) Configuration of Substrate Processing Apparatus

Figure 1:
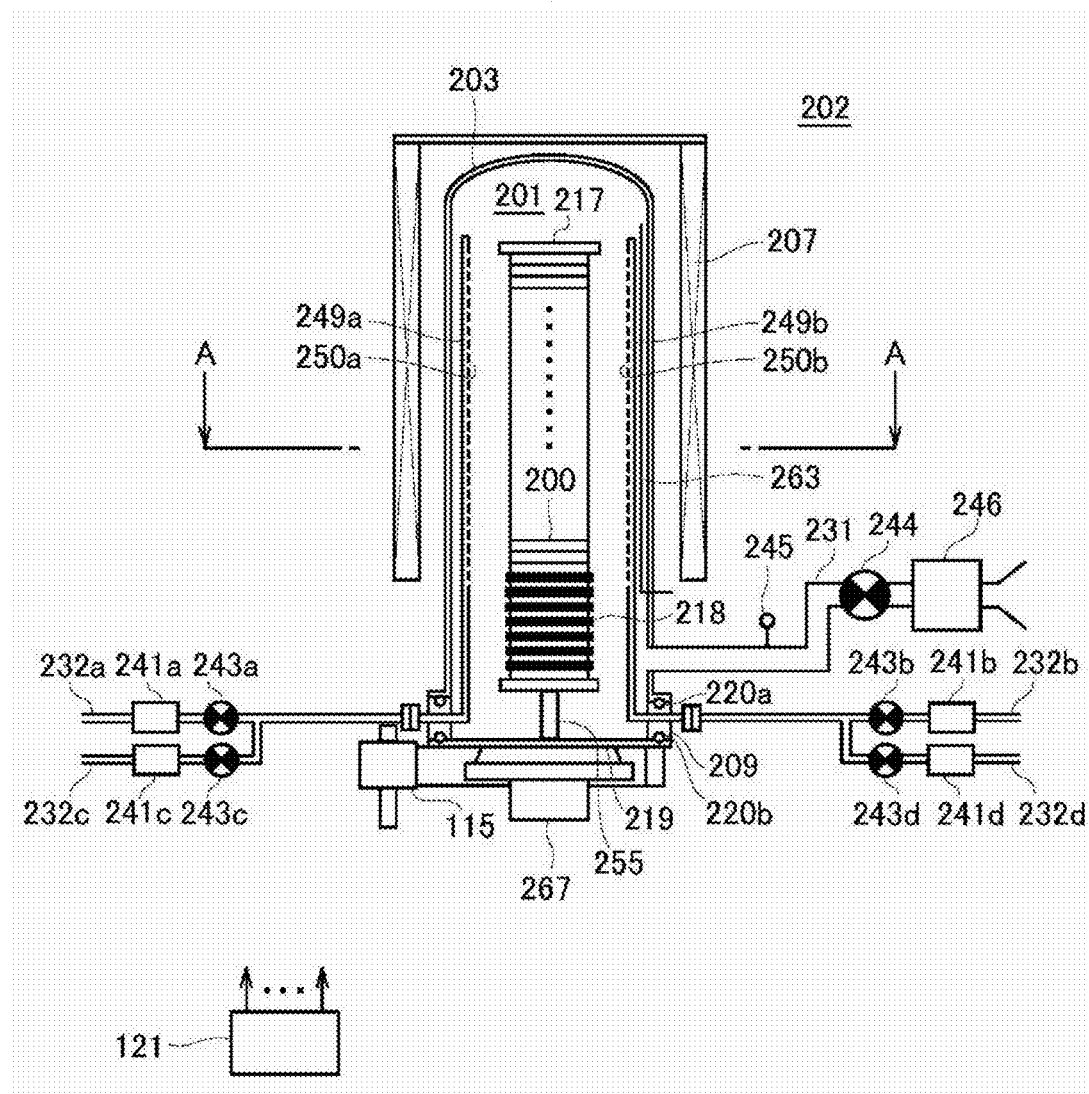
FIG. 1 is a schematic configuration view of a vertical processing furnace of a substrate processing apparatus used in one embodiment of the present disclosure, in which a portion of the processing furnace is shown in a vertical cross section.
Figure 2:
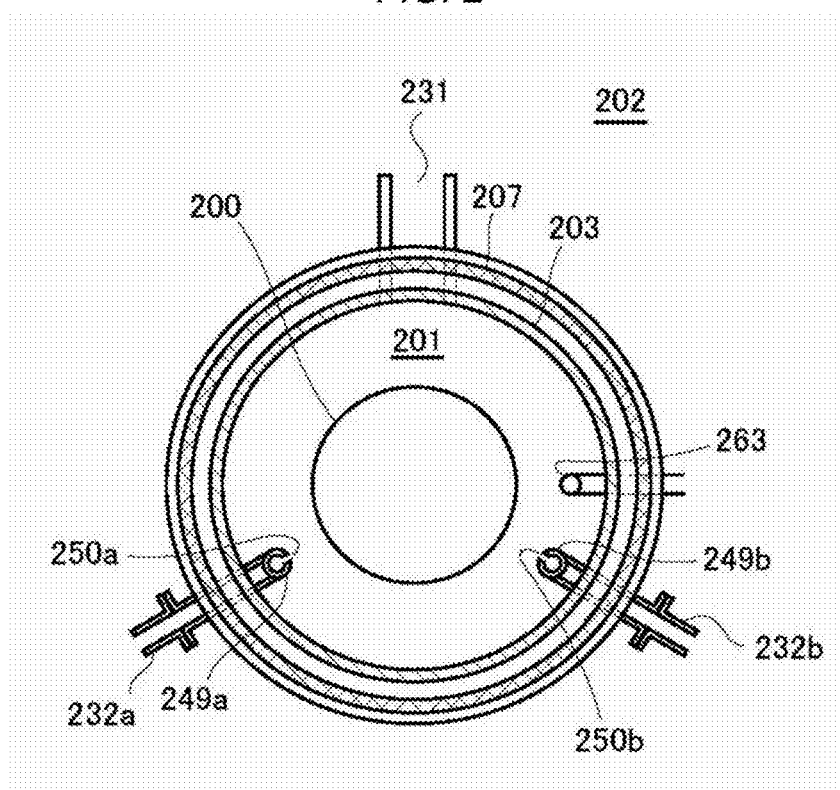
FIG. 2 is a schematic configuration view of the vertical processing furnace of the substrate processing apparatus used in one embodiment of the present disclosure, in which a portion of the processing furnace is shown in a cross section taken along line A-A in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. An upper end of the manifold 209 engages with a lower end of the reaction tube 203 such that the manifold 209 supports the reaction tube 203. An O-ring 220a as a seal member is installed between the manifold 209 and the reaction tube 203. The manifold 209 is supported by the heater base. Thus, the reaction tube 203 comes into a vertically mounted state. A process vessel (reaction vessel) is mainly configured by the reaction tube 203 and the manifold 209. A process chamber 201 is formed in a hollow cylindrical portion of the process vessel. The process chamber 201 is configured to accommodate a plurality of wafers 200 as substrates. The wafers 200 are horizontally stacked at multiple stages along a vertical direction in a boat 217 which will be described later.

Nozzles 249a and 249b are installed inside the process chamber 201 so as to penetrate through the manifold 209. The nozzles 249a and 249b are made of, e.g., a heat resistant material such as quartz, SiC or the like. Gas supply pipes 232a and 232b are respectively connected to the nozzles 249a and 249b. In this way, the two nozzles 249a and 249b and the two gas supply pipes 232a and 232b are installed in the reaction tube 203 and are configured to supply two kinds of gases into the process chamber 201.

Mass flow controllers (MFC) 241a and 241b, which are flow rate controllers (flow rate control parts), and valves 243a and 243b, which are opening/closing valves, are installed in the gas supply pipes 232a and 232b sequentially from respective upstream sides. Gas supply pipes 232c and 232d, which supply an inert gas, are respectively connected to the gas supply pipes 232a and 232b at respective downstream side of the valves 243a and 243b. MFCs 241c and 241d, which are flow rate controllers (flow rate control parts), and valves 243c and 243d, which are opening/closing valves, are installed in the gas supply pipes 232c and 232d sequentially from the respective upstream sides.

The nozzles 249a and 249b are respectively connected to end portions of the gas supply pipes 232a and 232b. As shown in FIG. 2, the nozzles 249a and 249b are disposed in an annular space defined between an inner wall of the reaction tube 203 and the wafers 200 such that the nozzles 249a to 249c extend upward along an arrangement direction of the wafers 200 from a lower portion of the inner wall of the reaction tube 203 to an upper portion thereof. Specifically, the nozzles 249a and 249b are installed along a wafer arrangement region in which the wafers 200 are arranged and in a region that horizontally surrounds the wafer arrangement region at a side of the wafer arrangement region. Each of the nozzles 249a and 249b is configured as an L-shaped long nozzle. A horizontal portion of each of the nozzles 249a and 249b is installed to penetrate a sidewall of the manifold 209. A vertical portion of each of the nozzles 249a and 249b is installed to extend upward at least from one end portion of the wafer arrangement region toward the other end portion thereof. A plurality of gas supply holes 250a and 250b through which a gas is supplied, is respectively formed in lateral surfaces of the nozzles 249a and 249b. Each of the gas supply holes 250a and 250b is opened toward the center of the reaction tube 203 to allow the gas to be supplied toward the wafers 200. There may be a plurality of gas supply holes 250a and 250b so as to span from the lower portion of the reaction tube 203 to the upper portion thereof. The respective gas supply holes 250a and 250b may have the same opening area and may be formed at the same opening pitch.

As described above, in this embodiment, a gas is transferred through the nozzles 249a and 249b, which are disposed in the vertically-elongated annular space, i.e., a cylindrical space, defined by the inner wall of the reaction tube 203 and the end portions of the wafers 200 arranged within the reaction tube 203. The gas is initially injected into the reaction tube 203, near the wafers 200, through the gas supply holes 250a and 250b respectively formed in the nozzles 249a and 249b. Accordingly, the gas supplied into the reaction tube 203 mainly flows in a direction parallel to surfaces of the wafers 200, i.e., in a horizontal direction. With this configuration, the gas can be uniformly supplied to the respective wafers 200. This makes it possible to improve the uniformity of a thickness of a thin film formed on each of the wafers 200. The gas flowing on the surfaces of the wafers 200, i.e., the reacted residual gas, flows toward an exhaust port, i.e., an exhaust pipe 231 which will be described later. The flow direction of the residual gas is not limited to a vertical direction but may be appropriately decided depending on the position of the exhaust port.

A precursor containing a metal element and a halogen element, for example, a titanium halide precursor gas containing titanium (Ti) as a metal element and a halogen element, is supplied from the gas supply pipe 232a into the process chamber 201 via the MFC 241a, the valve 243a and the nozzle 249a.

The titanium halide precursor gas refers to a gaseous titanium halide precursor, for example, a gas obtained by vaporizing a titanium halide precursor which remains in a liquid state under room temperature and atmospheric pressure, or a titanium halide precursor which remains in a gas state under room temperature and atmospheric pressure. The titanium halide precursor refers to a titanium precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. It can be said that the titanium halide precursor is one kind of metal halide or one kind of halide. When the term "precursor" is used herein, it may refer to "a liquid precursor staying in a liquid state," "a precursor gas staying in a gaseous state," or both.

As the titanium halide precursor gas, it may be possible to use, for example, a precursor gas containing Ti and Cl, namely a chloro titanium precursor gas. As the chloro titanium precursor gas, it may be possible to use, for example, a titanium tetrachloride ($TiCl_4$) gas. The $TiCl_4$ gas is an amino-group-free gas, namely a gas not containing nitrogen (N) and not containing carbon (C). In the case of using a liquid precursor, such as a $TiCl_4$ or the like, which stays in a liquid state under room temperature and atmospheric pressure, the liquid precursor is vaporized by a vaporization system such as a vaporizer or a bubbler and is supplied as a precursor gas ($TiCl_4$ gas).

An oxidant is supplied from the gas supply pipe 232b into the process chamber 201 via the MFC 241b, the valve 243b and the nozzle 249b. As the oxidant, it may be possible to use, for example, an oxygen-containing gas (oxidizing gas) such as water vapor ($H_2O$ gas) or the like. For example, pure water (or ultrapure water), such as RO water from which impurities are removed using a reverse osmosis membrane, deionized water from which impurities are removed by performing a deionization treatment, distilled water from which impurities are removed through distillation using a distillation device, or the like, is vaporized by a vaporization system such as a vaporizer, a bubbler or a boiler and is supplied as an oxidant ($H_2O$ gas).

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, and the nozzles 249a and 249b.

In the case of supplying the aforementioned precursor from the gas supply pipe 232a, a precursor supply system is mainly configured by the gas supply pipe 232a, the WC 241a and the valve 243a. The precursor supply system may also include the nozzle 249a. The precursor supply system may be referred to as a precursor gas supply system. In the case of supplying a titanium halide precursor from the gas supply pipe 232a, the precursor supply system may be referred to as a titanium halide precursor supply system or a titanium halide precursor gas supply system.

In the case of supplying the aforementioned oxidant from the gas supply pipe 232b, an oxidant supply system is mainly configured by the gas supply pipe 232b, the WC 241b, and the valve 243b. The oxidant supply system may also include the nozzle 249b. The oxidant supply system may be referred to as a reaction gas supply system, an oxygen-containing gas supply system or an oxidizing gas supply system.

In addition, an inert gas supply system is mainly configured by the gas supply pipes 232c and 232d, the MFCs 241c and 241d, and the valves 243c and 243d. The inert gas supply system may be referred to as a purge gas supply system or a carrier gas supply system.

An exhaust pipe 231 for exhausting an internal atmosphere of the process chamber 201 is installed in the reaction tube 203. A vacuum pump 246 as a vacuum exhaust device is coupled to the exhaust pipe 231 via a pressure sensor 245, which is a pressure detector (pressure detecting part) for detecting an internal pressure of the process chamber 201, and an auto pressure controller (APC) valve 244, which is an exhaust valve (pressure regulating part). The APC valve 244 is configured to perform or stop vacuum exhaust in the process chamber 201 by opening or closing the valve while actuating the vacuum pump 246 and is also configured to regulate the internal pressure of the process chamber 201 by adjusting an opening degree of the valve pursuant to a pressure information detected by the pressure sensor 245 while actuating the vacuum pump 246. An exhaust system is mainly configured by the exhaust pipe 231, the APC valve 244 and the pressure sensor 245. The exhaust system may include the vacuum pump 246. The exhaust pipe 231 may not be installed in the reaction tube 203. Similar to the nozzles 249a and 249b, the exhaust pipe 231 may be installed in the manifold 209.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotary mechanism 267 configured to rotate a boat 217 (to be described later) is installed at a side of the seal cap 219 opposite to the process chamber 201. A rotary shaft 255 of the rotary mechanism 267, which extends through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and out of the process chamber 201 by moving the seal cap 219 up and down. As such, the boat elevator 115 is configured as a transfer device (transfer mechanism) which transfers the boat 217 and the wafers 200 supported by the boat 217, into and out of the process chamber 201.

The boat 217 serving as a substrate support is configured to support the plurality of, e.g., 25 to 200 wafers 200 in such a state that the wafers 200 are arranged in a horizontal posture and in multiple stages along a vertical direction, namely arranged in a spaced-apart relationship, with the centers of the wafers 200 concentrically aligned with one another. The boat 217 is made of a heat resistant material such as quartz or SiC. Heat insulating plates 218 made of a heat resistant material such as quartz or SiC are installed below the boat 217 in a horizontal posture and in multiple stages. With this configuration, it is hard for the heat generated in the heater 207 to be radiated to the seal cap 219. However, this embodiment is not limited to the above-described configuration. For example, instead of installing the heat insulating plates 218 below the boat 217, a heat insulating tube as a tubular member made of a heat resistant material such as quartz or SiC may be installed below the boat 217.

A temperature sensor 263 serving as a temperature detector is installed inside the reaction tube 203. Based on a temperature information detected by the temperature sensor 263, a state of supplying electronic power to the heater 207 is adjusted such that the interior of the process chamber 201 has a predetermined temperature distribution. Similar to the nozzles 249a and 249b, the temperature sensor 263 is formed in an L-shape. The temperature sensor 263 is installed along the inner wall of the reaction tube 203.

Figure 3:
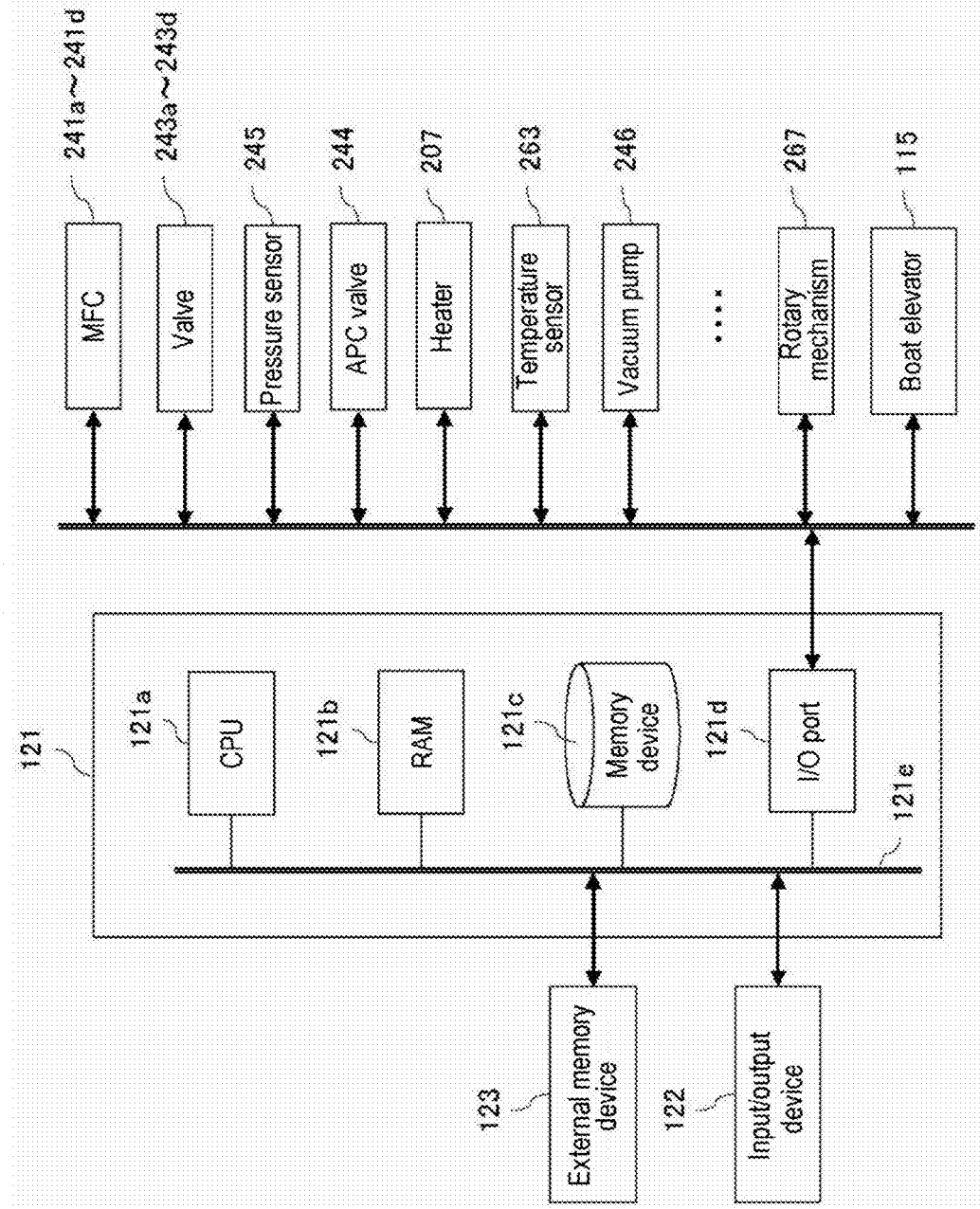
FIG. 3 is a schematic configuration view of a controller of the substrate processing apparatus used in one embodiment of the present disclosure, in which a control system of the controller is shown in a block diagram.

As illustrated in FIG. 3, a controller 121 as a control part (control means) is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 configured as, e.g., a touch panel or the like, is connected to the controller 121.

The memory device 121c may be, for example, a flash memory, a hard disc drive (HDD), or the like. A control program for controlling operations of a substrate processing apparatus or a process recipe in which a sequence or condition for processing a substrate to be described later is written, is readably stored in the memory device 121c. The process recipe functions as a program for causing the controller 121 to execute each sequence in the substrate processing procedure (to be described later), to obtain a predetermined result. Hereinafter, such a process recipe or control program will be collectively and simply referred to as a "program." When the term "program" is used herein, it may indicate a case of including a process recipe, a case of including a control program, or a case of including both a process recipe and a control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a also reads the process recipe from the memory device 121c according to an input of an operation command through the input/output device 122. The CPU 121a is configured to, according to contents of the process recipe thus read, control the flow rate adjusting operation of various kinds of gases performed by the MFCs 241a to 241d, the opening/closing operation of the valves 243a to 243d, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the operation of rotating the boat 217 with the rotary mechanism 267 and adjusting the rotation speed of the boat 217, the operation of moving the boat 217 up and down with the boat elevator 115, and the like.

The controller 121 is not limited to being configured as a dedicated computer but may be configured as a general-purpose computer. The controller 121 according to this embodiment may be configured by preparing an external memory device 123 (e.g., a magnetic tape, a magnetic disc such as a flexible disc or a hard disc, an optical disc such as a CD or a DVD, a magneto-optical disc such as an MO, or a semiconductor memory such as a USB memory or a memory card) which stores the aforementioned program, and installing a program in a general-purpose computer using the external memory device 123. However, a means for supplying a program to a computer is not limited to a case where the program is supplied through the external memory device 123. For example, the program may be supplied using a communication means such as the Internet or a dedicated line without going through the external memory device 123. The memory device 121c or the external memory device 123 is configured as a non-transitory computer-readable recording medium. Hereinafter, the memory device 121c and the external memory device 123 will be collectively and simply referred to as a "recording medium." When the term "recording medium" is used herein, it may indicate a case of including the memory device 121c, a case of including the external memory device 123, or a case of including both the memory device 121c and the external memory device 123.

(2) Film Forming Process

An example of a sequence for forming an oxide film containing a metal element, which is one process for manufacturing a semiconductor device by using the aforementioned substrate processing apparatus, will now be described with reference to FIG. 4. In the following descriptions, operations of the respective parts constituting the substrate processing apparatus are controlled by the controller 121.

In a film forming sequence illustrated in FIG. 4, a titanium oxide film ($TiO_2$ film) (hereinafter also referred to as a TiO film) as an oxide film containing Ti is formed on a wafer 200 by performing a cycle a predetermined number of times, the cycle including:

step 1 of continuously performing step 1A of supplying in advance a $H_2O$ gas as an oxidant to the wafer 200 as a substrate in the process chamber 201 and step 1B of simultaneously supplying the $H_2O$ gas and a $TiCl_4$ gas as a precursor to the wafer 200 in the process chamber 201, without having to purge an interior of the process chamber 201 between step 1A and step 1B;

step 2 of stopping the supply of the $H_2O$ gas and the $TiCl_4$ gas to the wafer 200 in the process chamber 201 and purging the interior of the process chamber 201; and step 3 of supplying the $H_2O$ gas to the wafer 200 in the purged process chamber 201.

In this embodiment, the expression "performing a cycle a predetermined number of times" means that the cycle is performed once or multiple times, namely that the cycle is performed once or more. FIG. 4 illustrates an example in which the cycle is repeated n times.

As used herein, the term "wafer" may refer to "a wafer itself" or "a laminated body (an assembly) of a wafer and a predetermined layer or film formed on a surface of the wafer" (namely, a wafer including a predetermined layer or film formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of a wafer as a laminated body".

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

Wafer Charging and Boat Loading

If a plurality of wafers 200 is charged to the boat 217 (in a wafer charging operation), as illustrated in FIG. 1, the boat 217 holding the plurality of wafers 200 is lifted up by the boat elevator 115 and is loaded into the process chamber 201 (in a boat loading operation). In this state, the seal cap 219 seals the lower end of the manifold 209 through the O-ring 220b.

Pressure Regulation and Temperature Adjustment

The interior of the process chamber 201, namely the space in which the wafers 200 exist, is vacuum-exhausted (depressurized and exhausted) by the vacuum pump 246 so as to reach a predetermined pressure (predetermined vacuum level). In this operation, an internal pressure of the process chamber 201 is measured by the pressure sensor 245. The APC valve 244 is feedback-controlled based on the measured pressure information. The vacuum pump 246 may be continuously activated at least until the process of the wafers 200 is completed. The wafers 200 in the process chamber 201 are heated by the heater 207 to a predetermined film forming temperature. In this operation, the state of supplying electric power to the heater 207 is feedback-controlled based on the temperature information detected by the temperature sensor 263 such that the interior of the process chamber 201 has a predetermined temperature distribution. The heating of the interior of the process chamber 201 by the heater 207 may be continuously performed at least until the process of the wafers 200 is completed. The boat 217 and the wafers 200 begin to be rotated by the rotary mechanism 267. The rotation of the boat 217 and the wafers 200 by the rotary mechanism 267 may be continuously performed at least until the process of the wafers 200 is completed.

TiO Film Forming Process

Thereafter, the following three steps, namely steps 1 to 3, are implemented.

Step 1

In this step, step 1A of supplying in advance the H$_2$O gas and step 1B of simultaneously supplying the H$_2$O gas and the TiCl$_4$ gas are continuously performed without having to purge the interior of the process chamber 201.

Step 1A

The valve 243b is opened to allow the H$_2$O gas to flow through the gas supply pipe 232b. A flow rate of the H$_2$O gas is adjusted by the MFC 241b. The H$_2$O gas is supplied from the gas supply holes 250b into the process chamber 201 and is exhausted from the exhaust pipe 231. At this time, the H$_2$O gas is supplied to the wafers 200. At the same time, the valve 243d is opened to allow a N$_2$ gas to flow through the gas supply pipe 232d. A flow rate of the N$_2$ gas is adjusted by the MFC 241d. The N$_2$ gas is supplied into the process chamber 201 together with the H$_2$O gas and is exhausted from the exhaust pipe 231.

In order to prevent entry of the H$_2$O gas into the nozzle 249a, the valve 243c is opened to allow the N$_2$ gas to flow through the gas supply pipe 232c. The N$_2$ gas is supplied into the process chamber 201 via the gas supply pipe 232a and the nozzle 249a and is exhausted from the exhaust pipe 231.

The supply flow rate of the H$_2$O gas controlled by the MFC 241b is set at a flow rate which falls within a range of, for example, 10 to 2,000 sccm, specifically 10 to 1,000 sccm. The supply flow rates of the N$_2$ gas controlled by the MFCs 241c and 241d are respectively set at a flow rate which falls within a range of, for example, 100 to 10,000 sccm. At this time, the APC valve 244 is appropriately adjusted so that the internal pressure of the process chamber 201 becomes a pressure which falls within a range of, for example, 30 to 400 Pa, specifically, 30 to 133 Pa. Furthermore, at this time, the temperature of the heater 207 is set such that the temperature of the wafers 200 becomes a temperature which falls within a range of, for example, room temperature or more and 300 degrees C. or less, specifically room temperature or more and 200 degrees C. or less, more specifically room temperature or more and 100 degrees C. or less.

The implementation time period of step 1A, namely the supply time period (irradiation time period) of the H$_2$O gas, may be set to be longer than the implementation time period of step 1B (to be described later), namely the supply time period (irradiation time period) of the H$_2$O gas and the TiCl$_4$ gas.

If the implementation time period of step 1A is shorter than the implementation time period of step 1B, there may a case where the supply amount of the H$_2$O gas supplied to the wafers 200, namely an adsorption amount of H$_2$O adsorbed onto the wafers 200, becomes insufficient. Furthermore, there may be a case where the below-described adsorption layer of H$_2$O formed on each of the wafers 200 becomes a discontinuous layer, namely a case where at least a portion of the surface of each of the wafers 200 is not covered with the adsorption layer of H$_2$O and is in a partially-exposed state. That is to say, there may be a case where the adsorption of H$_2$O onto the surface of each of the wafers 200 becomes insufficient.

By setting the implementation time period of step 1A longer than the implementation time period of step 1B, it is possible to supply a sufficient amount of H$_2$O gas to the wafers 200 and to increase the adsorption amount of H$_2$O adsorbed onto the wafers 200. Furthermore, it is possible to have H$_2$O densely and sufficiently adsorbed onto the entire surfaces of the wafers 200 with no gap. In addition, it is possible to have the adsorption layer of H$_2$O formed on each of the wafers 200 become a layer covering the entire surfaces of the wafers 200 without exposure, namely a continuous layer.

However, if the implementation time period of step 1A is too long, there may be a case where a time period required per one cycle is prolonged and the productivity of a film-forming process is reduced.

Accordingly, the implementation time period of step 1A may be set longer than the implementation time period of step 1B, for example, at a time period which falls within a range of 1 to 60 seconds.

By supplying the $H_2O$ gas to the wafers 200 under the aforementioned conditions, an adsorption layer of $H_2O$ is formed on each of the wafers 200 (on an underlying film of the surface of each of the wafers 200). The adsorption layer of $H_2O$ becomes a continuous layer which covers the entire surface of each of the wafers 200 with no gap.

As the oxidant, in addition to the $H_2O$ gas, it may be possible to use, for example, a gas containing O and H (a gas containing an O—H bond) such as a hydrogen peroxide ($H_2O_2$) gas or the like, a combination of a hydrogen ($H_2$) gas and an oxygen ($O_2$) gas, or a combination of a $H_2$ gas and an ozone ($O_3$) gas. As the inert gas, in addition to the $N_2$ gas, it may be possible to use, for example, rare gases such as an Ar gas, a He gas, a Ne gas, a Xe gas and the like.

Step 1B

After the adsorption layer of $H_2O$ is formed on each of the wafers 200, step 1B of simultaneously supplying the $H_2O$ gas and the $TiCl_4$ gas to the wafers 200 is implemented. Steps 1A and 1B are implemented without having to purge the interior of the process chamber 201 between steps 1A and 1B. That is to say, when continuously performing steps 1A and 1B, the supply of the $H_2O$ gas is not stopped but is maintained.

In this step, the opening/closing control of the valves 243a and 243b is executed in the same procedure as the opening/closing control of the valve 243b executed in step 1A. Furthermore, the opening/closing control of the valves 243c and 243d is executed in the same procedure as the opening/closing control of the valves 243c and 243d executed in step 1A. In addition, the valve 243b is kept opened from step 1A to step 1B.

The supply flow rate of the $TiCl_4$ controlled by the MFC 241a is set at a flow rate which falls within a range of, for example, 10 to 2,000 sccm, specifically 10 to 1,000 sccm. The supply flow rate of the $H_2O$ gas controlled by the MFC 241b and the supply flow rates of the $N_2$ gas controlled by the MFCs 241c and 241d are respectively set at the same flow rates as those of step 1A.

At this time, the APC valve 244 is appropriately adjusted to set the internal pressure of the process chamber 201 at a pressure which falls within a range of, for example, 30 to 400 Pa, specifically 30 to 133 Pa. If the internal pressure of the process chamber 201 exceeds 400 Pa, a CVD reaction is too strong (an excessive gas phase reaction is generated). Thus, the uniformity of the thickness of a TiO layer (to be described later), namely the uniformity of the thickness of a finally-formed TiO film, is likely to deteriorate and is difficult to control. Furthermore, particles are likely to be generated within the process chamber 201 so that the quality of the TiO film is likely to be reduced. By setting the internal pressure of the process chamber 201 at 400 Pa or less, it is possible to sufficiently suppress the excessive gas phase reaction otherwise generated within the process chamber 201. By setting the internal pressure of the process chamber 201 at 133 Pa or less, it is possible to further sufficiently suppress the excessive gas phase reaction otherwise generated within the process chamber 201.

At this time, similar to step 1A, the temperature of the heater 207 is set such that the temperature of the wafers 200 becomes a temperature which falls within a range of, for example, room temperature or more and 300 degrees C. or less, specifically room temperature or more and 200 degrees C. or less, more specifically room temperature or more and 100 degrees C. or less.

It is difficult to perform the film forming process at the temperature of the wafers 200 at less than room temperature. For example, if the temperature of the wafers 200 is less than the room temperature, it becomes difficult to appropriately generate the below-described gas phase reaction between the $H_2O$ gas and the $TiCl_4$ gas supplied into the process chamber 201, or the below-described surface reaction between the adsorption layer of $H_2O$ formed on each of the wafers 200 and the $TiCl_4$ gas. As a result, there may be a case where the efficiency of deposition of $TiO_2$ (hereinafter also referred to as "TiO") on the wafers 200 is reduced and a case where a formation rate of a TiO layer (to be described later), namely a deposition rate of a finally-formed TiO film, is reduced. Moreover, the amount of Cl remaining in the TiO layer is likely to be increased so that the quality of the TiO film is reduced. By setting the temperature of the wafers 200 at room temperature or more, it is possible to appropriately generate the gas phase reaction within the process chamber 201 and the surface reaction on the wafers 200. This makes it possible to increase the formation rate of the TiO layer, namely the deposition rate of the finally-formed TiO film. In addition, by setting the temperature of the wafers 200 at room temperature or more, it is possible to reduce the amount of Cl remaining in the TiO layer and to improve the quality of the TiO film.

However, if the temperature of the wafers 200 exceeds 300 degrees C., the TiO layer formed on each of the wafers 200 is crystallized and a surface roughness of the TiO layer, namely a surface roughness of the TiO film, is likely to deteriorate. Furthermore, the efficiency of deposition of TiO onto the wafers 200 is likely to be reduced so that the formation rate of the TiO layer, namely the deposition rate of the TiO film, is reduced. The term "surface roughness" refers to a height difference within a wafer plane or an arbitrary target plane and has the same meaning as a surface coarseness. The expression "the surface roughness is improved (good)" means that the height difference is decreased (small), namely that the surface is smoothened (smooth). The expression "the surface roughness is deteriorated (poor)" means that the height difference is increased (large), namely that the surface is roughened (rough).

By setting the temperature of the wafers 200 at 300 degrees C. or less, it is possible to suppress the crystallization of the TiO layer and to improve the surface roughness of the TiO layer, namely the surface roughness of the TiO film. Furthermore, it is possible to improve the efficiency of deposition of TiO on the wafers 200 and to increase the formation rate of the TiO layer, namely the deposition rate of the TiO film. Moreover, it is possible to reduce the amount of heat applied to the wafers 200 and to satisfactorily perform the control of thermal hysteresis suffered by the wafers 200.

By setting the temperature of the wafers 200 at 200 degrees C. or less, ultimately 100 degrees C. or less, it is possible to reliably suppress the crystallization of the TiO layer and to further improve the surface roughness of the TiO layer, namely the surface roughness of the TiO film. Furthermore, it is possible to further improve the efficiency of deposition of TiO onto the wafers 200 and to further increase the formation rate of the TiO layer, namely the deposition rate of the TiO film. Moreover, it is possible to further reduce the amount of heat applied to the wafers 200 and to further satisfactorily perform the control of thermal hysteresis suffered by the wafers 200.

For that reason, the temperature of the wafers 200 may be set to fall within a range of room temperature or more and 300 degrees C. or less, specifically room temperature or more and 200 degrees C. or less, more specifically room temperature or more and 100 degrees C. or less.

By supplying the $H_2O$ gas and the $TiCl_4$ gas to the wafers 200 under the aforementioned conditions, the gas phase reaction between $H_2O$ gas and the $TiCl_4$ gas and the surface reaction between the adsorption layer of $H_2O$ formed on each of the wafers 200 and the $TiCl_4$ gas are appropriately generated within the process chamber 201. That is to say, two different reactions called the gas phase reaction and the surface reaction are simultaneously generated. As the two kinds of reactions are appropriately generated in a balanced manner, TiO is efficiently deposited on the wafers 200 (the underlying films of the surfaces thereof). Thus, an oxide layer containing Ti, namely a titanium oxide layer ($TiO_2$ layer) (hereinafter also referred to as a "TiO layer"), is formed on each of the wafers 200. When the $H_2O$ gas and the $TiCl_4$ gas undergoes the gas phase reaction, a reaction intermediate containing at least Ti or O is generated in the course of the gas phase reaction. TiO as a final product produced by the additional reaction of the reaction intermediate is deposited on the wafers 200.

Furthermore, if the thickness of the TiO layer formed in step 1B exceeds 10 Å (1 nm), it becomes difficult for a modification action in step 3 (to be described later) to reach the entire TiO layer. A minimum value of the thickness of the TiO layer that can be formed on each of the wafers 200 is less than 1 Å (0.1 nm). Accordingly, the thickness of the TiO layer may be set at a thickness of, for example, about 1 to 10 Å. By setting the thickness of the TiO layer at a thickness which falls within the aforementioned range, it is possible to relatively increase the action of the modification reaction in step 3 (to be described later) and to shorten a time period required in the modification reaction in step 3. It is also possible to shorten the time period required in the formation of the TiO layer in step 1B. As a result, it is possible to shorten the processing time per one cycle and to shorten the total processing time. That is to say, it is possible to increase the deposition rate. In addition, by setting the thickness of the TiO layer at a thickness which falls within the aforementioned range, it is possible to enhance the controllability of the film thickness uniformity.

Furthermore, the time period during which the $H_2O$ gas and the $TiCl_4$ gas are supplied to the wafers 200, namely the gas supply time period (irradiation time period), is set at a time period which falls within a range of, for example, 1 to 30 seconds, specifically 1 to 20 seconds, more specifically 1 to 10 seconds. By doing so, it is possible to have the thickness of the TiO layer formed in step 1B become a thickness which falls within the aforementioned range.

As the precursor, in addition to the $TiCl_4$ gas, it may be possible to use, for example, a precursor containing Ti and a fluoro group, such as titanium tetrafluoride ($TiF_4$) or the like. As the oxidant, in addition to the $H_2O$ gas, it may be possible to use the oxygen-containing gases described above. As the inert gas, in addition to the $N_2$ gas, it may be possible to use, for example, various kinds of rare gases described above.

Step 2

After the TiO layer is formed, the valves 243a and 243b are closed to simultaneously stop the supply of the $TiCl_4$ gas and the supply of the $H_2O$ gas. At this time, while keeping the APC valve 244 opened, the interior of the process chamber 201 is evacuated by the vacuum pump 246. Thus, the $TiCl_4$ gas and the $H_2O$ gas remaining within the process chamber 201, which have not reacted or which have contributed to the formation of the TiO layer, are removed from the interior of the process chamber 201.

If steps 1A and 1B described above are implemented, the $H_2O$ gas, the $TiCl_4$ gas, the aforementioned reaction intermediate or the like adheres to (is adsorbed to) to the inner wall of the reaction tube 203, the surface of the boat 217 or the like. These gases or the reaction intermediate adhering to the inner wall of the reaction tube 203 or the like are gradually separated from the inner wall of the reaction tube 203 or the like during or after the implementation of step 1B. By implementing step 2, it is possible to remove the gases or the reaction intermediate adhering to the inner wall of the reaction tube 203 or the like from the interior of the process chamber 201. Furthermore, if step 1B described above is implemented, a reaction byproduct is generated within the process chamber 201. By implementing step 2, it is possible to remove the reaction byproduct remaining within the process chamber 201 from the interior of the process chamber 201. Hereinafter, the gases, the reaction intermediate and the reaction byproduct adhering to the inner wall of the reaction tube 203 or the like will be regarded as being included in the gas remaining within the process chamber 201.

In step 2, the supply of the $N_2$ gas into the process chamber 201 is maintained while keeping the valves 243c and 243d opened. The $N_2$ gas acts as a purge gas. This makes it possible to enhance the effect of removing the gases, the reaction intermediate and the reaction byproduct remaining within the process chamber 201 from the interior of the process chamber 201. The supply flow rates of the $N_2$ gas controlled by the MFCs 241c and 241d are the same as those of step 1. The implementation time period of step 2 (the purge time period) is set at, for example, 1 to 60 seconds.

In this case, the gases remaining within the process chamber 201 may not be completely discharged and the interior of the process chamber 201 may not be completely purged. If the amount of the gases remaining within the process chamber 201 is small, an adverse effect may not be generated in subsequent step 3. The flow rate of the $N_2$ gas supplied into the process chamber 201 need not be made large. For example, an amount of the $N_2$ gas to be supplied into the process chamber 201 may be set substantially equal to the volume of the reaction tube 203 (the process chamber 201). This makes it possible to perform a purge operation without causing an adverse effect in step 2. As such, by not completely purging the interior of the process chamber 201, it is possible to shorten the purge time period and to improve the throughput. It is also possible to suppress the consumption of the $N_2$ gas to a necessary minimum level.

As the inert gas, in addition to the $N_2$ gas, it may be possible to use, for example, various kinds of rare gases described above.

Step 3

After step 2 is completed, the $H_2O$ gas is supplied to the wafers 200 in the process chamber 201.

At this step, the opening/closing control of the valves 243b to 243d is executed in the same procedure as the opening/closing control of the valves 243b to 243d executed in step 1A. Processing conditions of step 3 are the same as the processing conditions of step 1A.

The implementation time period of step 3, namely the supply time period (irradiation time period) of the $H_2O$ gas, may be set longer than the implementation time period of step 1B, namely the supply time period (irradiation time period) of the $H_2O$ gas and the $TiCl_4$ gas.

If the implementation time period of step 3 is shorter than the implementation time period of step 1B, there may be a case where the supply amount of the $H_2O$ gas supplied to the wafers 200 becomes insufficient. Furthermore, there may be a case where the below-described modification process for the TiO layer formed on each of the wafers 200 becomes insufficient.

By setting the implementation time period of step 3 longer than the implementation time period of step 1B, it is possible to supply a sufficient amount of $H_2O$ gas to the surfaces of the wafers 200 and to sufficiently perform the modification process with respect to the TiO layer formed on each of the wafers 200.

However, if the implementation time period of step 3 is too long, there may be a case where the time period required per cycle is prolonged so that the productivity of the film forming process is reduced.

Accordingly, similar to step 1A, the implementation time period of step 3 may be set longer than the implementation time period of step 1B, for example, at a time period which falls within a range of 1 to 60 seconds.

By supplying the $H_2O$ gas to the wafers 200 under the aforementioned conditions, the TiO layer formed on each of the wafers 200 in step 1B is modified (oxidized). At this time, an impurity such as Cl or the like contained in the TiO layer is extracted or desorbed from the TiO layer. Thus, the TiO layer becomes a layer having a low concentration of impurity. In addition, as the TiO layer is modified, the TiO layer becomes a dense layer having a high density.

As the oxidant, in addition to the $H_2O$ gas, it may be possible to use, for example, the oxygen-containing gases described above. As the inert gas, in addition to the $N_2$ gas, it may be possible to use, for example, various kinds of rare gases described above.

Performing a Predetermined Number of Times

The cycle including steps 1 to 3 described above is implemented once or more (a predetermined number of times) to thereby form a TiO film having a predetermined composition and a predetermined thickness on each of the wafers 200.

In this embodiment, during the implementation time period of step 3 in the $m^{th}$ cycle (where m is an integer of 1 or more), step 1A in the $m+1^{th}$ cycle is implemented (the implementation time period of step 3≥the implementation time period of step 1A). During the implementation time period of step 1A in the $m+1^{th}$ cycle, step 3 in the $m^{th}$ cycle may be implemented (the implementation time period of step 1A≥the implementation time period of step 3). FIG. 4 illustrates an example in which when performing the cycle a predetermined number of times, step 3 of supplying the $H_2O$ gas after the purge process in the $m^{th}$ cycle and step 1A of supplying in advance the $H_2O$ gas in the $m+1^{th}$ cycle are implemented simultaneously. In the film forming sequence illustrated in FIG. 4, in step 1A of the first cycle, the formation of the adsorption layer of $H_2O$ on each of the wafers 200 is performed. In step 1A of the second and subsequent cycles, the formation of the adsorption layer of $H_2O$ on each of the wafers 200 and the modification process of the TiO layer formed on each of the wafers 200 are performed simultaneously.

The aforementioned cycle may be repeated multiple times. That is to say, the thickness of the TiO layer formed per one cycle may be set to become smaller than a predetermined film thickness. The aforementioned cycle may be repeated multiple times until the predetermined film thickness is obtained. For example, the thickness of the TiO layer formed per one cycle may be set at the thickness described above and the aforementioned cycle may be repeated multiple times until the thickness of the TiO film becomes equal to a predetermined film thickness, for example, 10 to 20 nm.

In the case where the cycle is performed multiple times, in the respective steps performed after at least the second cycle, the expression reading "a predetermined gas is supplied to the wafer 200" means that "a predetermined gas is supplied to the layer formed on the wafer 200, namely the uppermost surface of the wafer 200 as a laminated body." The expression reading "a predetermined layer is formed on the wafer 200" means that "a predetermined layer is formed on the layer formed on the wafer 200, namely the uppermost surface of the wafer 200 as a laminated body." This is the same as described above. This holds true in the modifications and other embodiments which will be described later.

Purging and Atmospheric Pressure Restoring

The valves 243c and 243d are opened. The $N_2$ gas is supplied into the process chamber 201 from each of the gas supply pipes 232c and 232d and is exhausted from the exhaust pipe 231. The $N_2$ gas acts as a purge gas. Thus, the interior of the process chamber 201 is purged so that the gases or the reaction byproducts remaining within the process chamber 201 are removed from the interior of the process chamber 201 (in a purging process). Thereafter, the internal atmosphere of the process chamber 201 is substituted with an inert gas (in an inert gas substituting process), and the internal pressure of the process chamber 201 is restored to atmospheric pressure (in an atmospheric pressure restoring process).

Boat Unloading and Wafer Discharging

The seal cap 219 is moved down by the boat elevator 115 to open the lower end of the manifold 209. The processed wafers 200 supported by the boat 217 are unloaded from the lower end of the manifold 209 outside of the reaction tube 203 (in a boat unloading process). Thereafter, the processed wafers 200 are discharged from the boat 217 (in a wafer discharging process).

(3) Effects According to this Embodiment

According to this embodiment, one or more effects may be achieved as follows.

(a) By implementing step 1A of supplying in advance the $H_2O$ gas to the wafers 200 in the process chamber 201, namely by previously forming the adsorption layer of $H_2O$ on the surface of each of the wafers 200 prior to starting step 1B, in subsequent step 1B, it is possible to appropriately generate the gas phase reaction between the $H_2O$ gas and the $TiCl_4$ gas within the process chamber 201 and to appropriately generate the surface reaction between the adsorption layer of $H_2O$ formed on each of the wafers 200 and the $TiCl_4$ gas. Thus, even under the low temperature condition of, for example, room temperature or more and 300 degrees C. or less, it is possible to increase the formation rate of the TiO layer on each of the wafers 200, namely the deposition rate of the finally-formed TiO film. That is to say, by simultaneously generating two different reactions called the gas phase reaction and the surface reaction, it is possible to reduce the deposition temperature of the TiO film. It is also possible to increase the deposition rate of the TiO film and to improve the productivity of the film forming process.

(b) By continuously implementing step 1A and step 1B without having to purge the interior of the process chamber 201 between steps 1A and 1B, namely by not stopping and maintaining the supply of the $H_2O$ gas in step 1 (from step 1A to step 1B), it is possible to have the TiO film formed on each of the wafers 200 become a film which is high in the in-plane film thickness uniformity and the in-plane film quality uniformity.

Specifically, if step 1A and step 1B are discontinuously implemented while purging the interior of the process chamber 201 between steps 1A and 1B, there may be a case where the implementation time period of step 1A, namely the supply amount of the $H_2O$ gas supplied to the wafers 200, becomes insufficient. As a result, there may be a case where the adsorption layer of $H_2O$ formed on each of the wafers 200 becomes a discontinuous layer. In contrast, as in this embodiment, if step 1A and step 1B are continuously implemented while bypassing the purging process on the interior of the process chamber 201 between steps 1A and 1B, it is possible to sufficiently secure the implementation time period of step 1A and to sufficiently increase the supply amount of the $H_2O$ gas. As a consequence, it is possible to have $H_2O$ densely adsorbed onto the entire surfaces of the wafers 200 with no gap. In addition, it is possible to have the adsorption layer of $H_2O$ formed on each of the wafers 200 become a continuous layer.

Furthermore, if step 1A and step 1B are discontinuously implemented while purging the interior of the process chamber 201 between steps 1A and 1B, there may be a case where in the middle of the purging process, $H_2O$ adsorbed onto the wafers 200 is desorbed so that the adsorption amount of $H_2O$ adsorbed onto the wafers 200 is reduced. Furthermore, there may be a case where the surface of each of the wafers 200 covered with the adsorption layer of $H_2O$ is partially exposed so that the adsorption layer of $H_2O$ becomes a discontinuous layer. In contrast, as in this embodiment, if step 1A and step 1B are continuously implemented while bypassing the purging process on the interior of the process chamber 201 between steps 1A and 1B, it is possible to start step 1B while maintaining the adsorption amount of $H_2O$ on the wafers 200 and while keeping the adsorption layer of $H_2O$ in a continuous state.

By allowing $H_2O$ to be densely adsorbed onto the entire surfaces of the wafers 200 with no gap so that the adsorption layer of $H_2O$ becomes a continuous layer, and by starting step 1B while maintaining this state, it is possible to appropriately generate the surface reaction between the adsorption layer of $H_2O$ and the $TiCl_4$ gas under a uniform condition over the entire region of the surfaces of the wafers 200. As a result, it is possible to have the thickness or the quality of the TiO layer formed on each of the wafers 200 become uniform over the entire in-plane region of the wafers 200. That is to say, it is possible to have the finally-formed TiO film become a film which is high in in-plane film thickness uniformity and in-plane film quality uniformity.

(c) By implementing step 2 of purging the interior of the process chamber 201 between step 1B and step 3, it is possible to improve the in-plane film thickness uniformity and the in-plane film quality uniformity of the TiO film.

Specifically, if step 1B is implemented, as described above, the $TiCl_4$ gas, the reaction intermediate or the like adheres to the inner wall of the reaction tube 203 or the like. The $TiCl_4$ gas or the reaction intermediate adhering to the inner wall of the reaction tube 203 or the like is gradually separated from the inner wall of the reaction tube 203 or the like during and after the implementation of step 1B. Thus, if step 3 is implement without implementing step 2 after completion of step 1B, there may be a case where the $TiCl_4$ gas or the reaction intermediate separated from the inner wall of the reaction tube 203 or the like after completion of step 1B reacts with $H_2O$ supplied into the process chamber 201 in step 3, as a result of which undesired TiO is deposited on the wafers 200. At this time, the $TiCl_4$ gas or the reaction intermediate separated from the inner wall of the reaction tube 203 or the like is supplied at a large amount to the portions of the wafers 200 close to the inner wall of the process chamber 201, namely the outer periphery portions of the wafers 200, rather than the central portions of the wafers 200. Thus, there is a strong tendency that a large amount of undesired TiO is deposited on the outer periphery portions of the wafers 200 rather than the central portions of the wafers 200. As a result, the thickness of the TiO film in the outer periphery portions of the wafers 200 becomes larger than the thickness of the TiO film in the central portions of the wafers 200. Thus, the in-plane film thickness uniformity of the TiO film is likely to degrade. In addition, a difference is generated between the film quality of the TiO film in the outer periphery portions of the wafers 200 and the film quality of the TiO film in the central portions of the wafers 200. Thus, the in-plane film quality uniformity of the TiO film is likely to degrade.

In contrast, by implementing step 2 of purging the interior of the process chamber 201 between step 1B and step 3 as in this embodiment, it is possible to avoid the aforementioned affect caused by the $TiCl_4$ gas or the reaction intermediate adhering to the inner wall of the reaction tube 203 or the like. As a result, it is possible to improve the in-plane film thickness uniformity and the in-plane film quality uniformity of the TiO film.

(d) Instead of continuously generating the gas phase reaction between the $H_2O$ gas and the $TiCl_4$ gas until the thickness of the TiO film becomes a desired thickness, the cycle including steps 1 to 3 is performed a predetermined number of times until the thickness of the TiO film becomes a desired thickness. It is therefore possible to improve the step coverage and the thickness controllability of the finally-formed TiO film. Furthermore, by implementing step 2 of purging the interior of the process chamber 201 a predetermined number of times in every cycle, namely during the film-forming process, it is possible to efficiently remove the reaction byproduct generated within the process chamber 201 from the interior of the process chamber 201. Thus, it is possible to restrain the reaction byproduct from being introduced into the TiO film or adhering to the surface of the TiO film, thereby improving the quality of the TiO film. Furthermore, by implementing step 3 of modifying the TiO layer a predetermined number of times in every cycle, namely during the film-forming process, it is possible to uniformly reduce the concentration of the impurity such as Cl or the like in the finally-formed TiO film over the thickness direction thereof. In addition, it is possible to make the quality of the finally-formed TiO film uniform over the thickness direction thereof.

(e) By implementing step 1A in the $m+1^{th}$ cycle during the implementation time period of step 3 in the $m^{th}$ cycle or by implementing step 3 in the $m^{th}$ cycle during the implementation time period of step 1A in the $m+1^{th}$ cycle, it is possible to shorten the total time required in the film-forming process. That is to say, by simultaneously performing the formation of the adsorption layer of $H_2O$ on each of the wafers 200 and the modification process of the TiO layer formed on each of the wafers 200, it is possible to shorten the total time required in the film-forming process and to improve the productivity of the film-forming process.

(f) By using the N- and C-free titanium halide precursor such as the $TiCl_4$ gas or the like, it is possible to have the TiO film become a film having a small amount of impurity such as C or N. Specifically, if a precursor gas containing Ti and an amino group such as, e.g., tetrakis(dimethylamino) titanium $(Ti[N(CH_3)_2]_4$, abbreviation: TDMAT) gas or the like, namely a titanium precursor containing N and C, is used in step 1B, there may be a case where the N component or the C component contained in the precursor is introduced into the TiO film. In contrast, if the amino-group-free precursor, namely the N- and C-free precursor, is used as in this embodiment, it is possible to avoid the introduction of the C or N component into the TiO film and to have the finally-formed TiO film become a film which is low in concentration of impurities such as C or N. This enables the TiO film to become, for example, a film having a high insulating property, namely a film having a high leak resistance.

(g) By using the titanium halide precursor, such as the $TiCl_4$ gas or the like, which contains a plurality of halogen elements (Cl) in one molecule, even under a low temperature condition of, for example, room temperature or more and 300 degrees C. or less, it is possible to efficiently form the TiO layer and to increase the deposition rate of the TiO film. In addition, it is possible to reduce the consumption amount of the $TiCl_4$ gas not contributed to film formation and to reduce the film formation cost.

(h) The respective effects described above can be similarly achieved in a case where a gas other than the $TiCl_4$ gas is used as the precursor gas, a case where an oxygen-containing gas other than the $H_2O$ gas is used as the oxidant, or a case where an inert gas other than the $N_2$ gas is used as the purge gas.

(4) Modifications

The film forming process according to this embodiment is not limited to the aspects described above and may be modified as in the modifications which will be described below.

Modification 1

Figure 4:
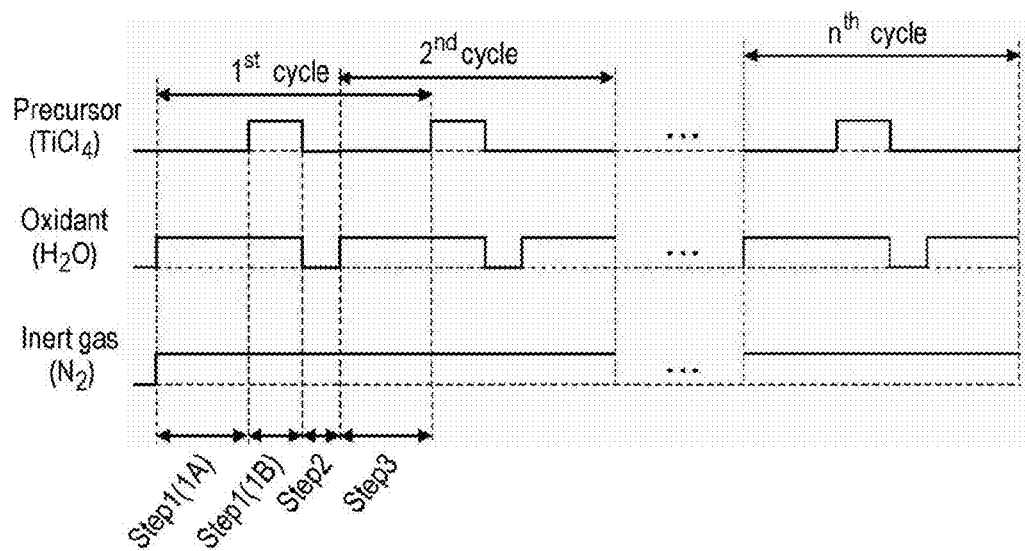
FIG. 4 is a view illustrating gas supply timings in a film forming sequence according to one embodiment of the present disclosure.
Figure 5:
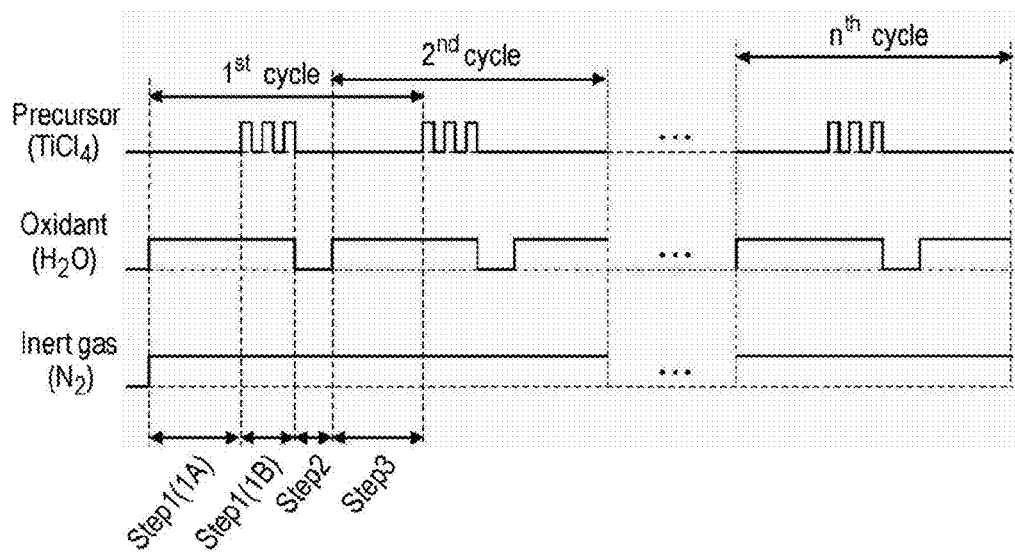
FIG. 5 is a view illustrating modification 1 of the gas supply timings in the film forming sequence according to one embodiment of the present disclosure.

For example, as illustrated in FIG. 5, in step 1B, the supply of the $TiCl_4$ gas may be intermittently performed multiple times. Except the aforementioned point, processing procedures and processing conditions of this modification are the same as those of the film forming sequence illustrated in FIG. 4. FIG. 5 illustrates an example in which in step 1B, the supply of the $TiCl_4$ gas is intermittently performed three times.

Modification 2

Figure 6:
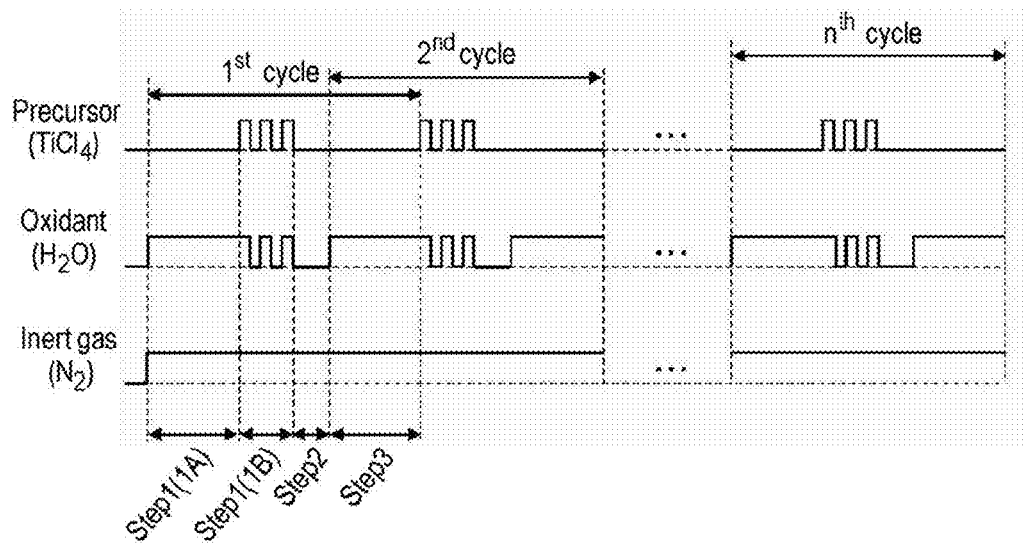
FIG. 6 is a view illustrating modification 2 of the gas supply timings in the film forming sequence according to one embodiment of the present disclosure.

For example, as illustrated in FIG. 6, in step 1B, each of the supply of the $TiCl_4$ gas and the supply of the $H_2O$ gas may be intermittently performed multiple times. Except the aforementioned point, processing procedures and processing conditions of this modification are the same as those of the film forming sequence illustrated in FIG. 4. FIG. 6 illustrates an example in which in step 1B, each of the supply of the $TiCl_4$ gas and the supply of the $H_2O$ gas is intermittently performed three times.

Modification 3

Figure 7:
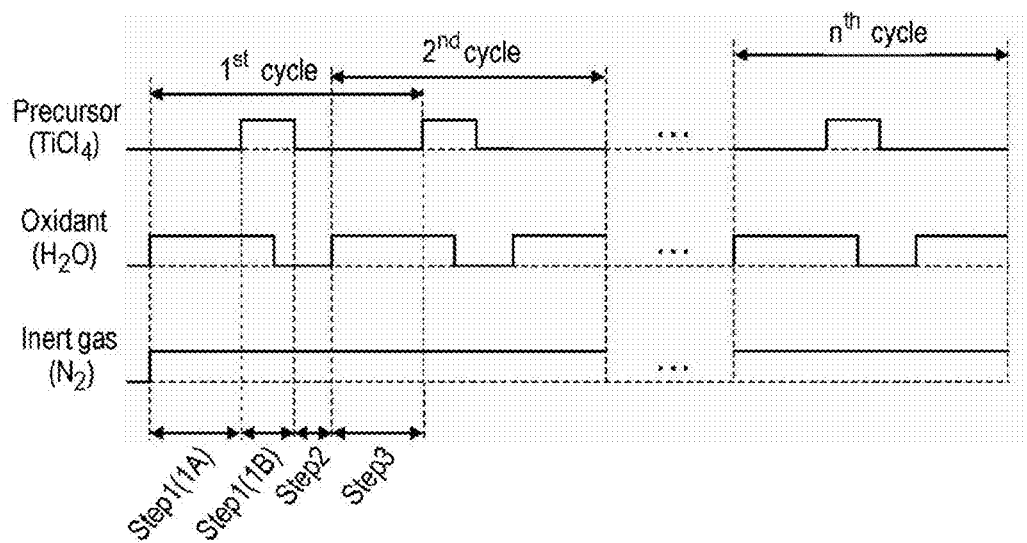
FIG. 7 is a view illustrating modification 3 of the gas supply timings in the film forming sequence according to one embodiment of the present disclosure.

For example, as illustrated in FIG. 7, in step 1B, the supply of the $H_2O$ gas may be stopped earlier than the stop of the supply of the $TiCl_4$ gas. Except for the aforementioned point, processing procedures and processing conditions of this modification are the same as those of the film forming sequence illustrated in FIG. 4.

Modification 4

For example, in step 1B, the supply of the $TiCl_4$ gas may be stopped earlier than the stop of the supply of the $H_2O$ gas. Except for the aforementioned point, processing procedures and processing conditions of this modification are the same as those of the film forming sequence illustrated in FIG. 4.

Modification 5

Figure 8:
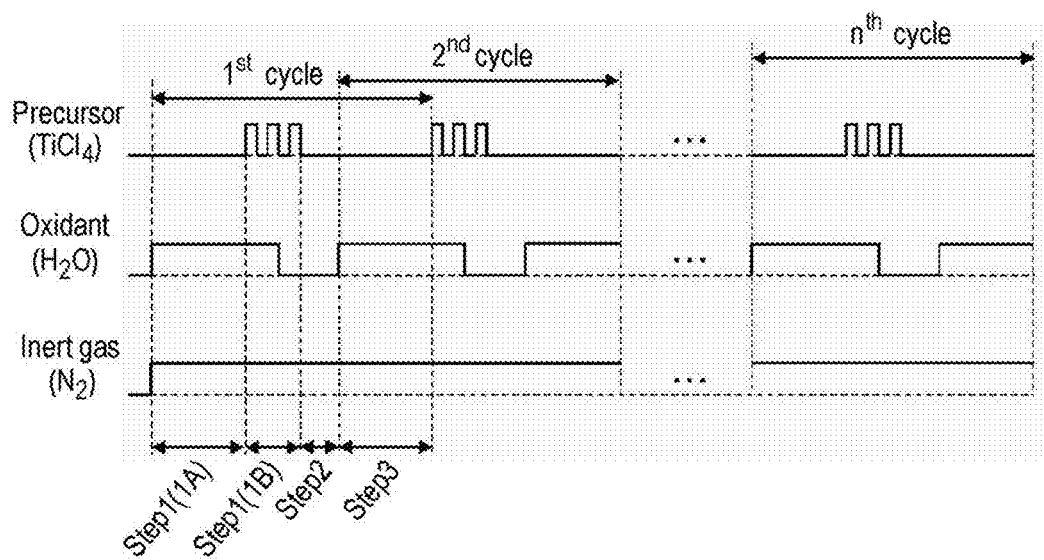
FIG. 8 is a view illustrating modification 5 of the gas supply timings in the film forming sequence according to one embodiment of the present disclosure.

For example, as illustrated in FIG. 8, in step 1B of modification 1, the supply of the $H_2O$ gas may be stopped earlier than the stop of the supply of the $TiCl_4$ gas. That is to say, in step 1B, the supply of the $TiCl_4$ gas may be intermittently performed multiple times and the supply of the $H_2O$ gas may be stopped earlier than the stop of the supply of the $TiCl_4$ gas. Except for the aforementioned points, processing procedures and processing conditions of this modification are the same as those of the film forming sequence illustrated in FIG. 4.

Modification 6

For example, in step 1B of modification 1, the supply of the $TiCl_4$ gas may be stopped earlier than the stop of the supply of the $H_2O$ gas. That is to say, in step 1B, the supply of the $TiCl_4$ gas may be intermittently performed multiple times and the supply of the $TiCl_4$ gas may be stopped earlier than the stop of the supply of the $H_2O$ gas. Except for the aforementioned points, processing procedures and processing conditions of this modification are the same as those of the film forming sequence illustrated in FIG. 4.

Modification 7

Figure 9:
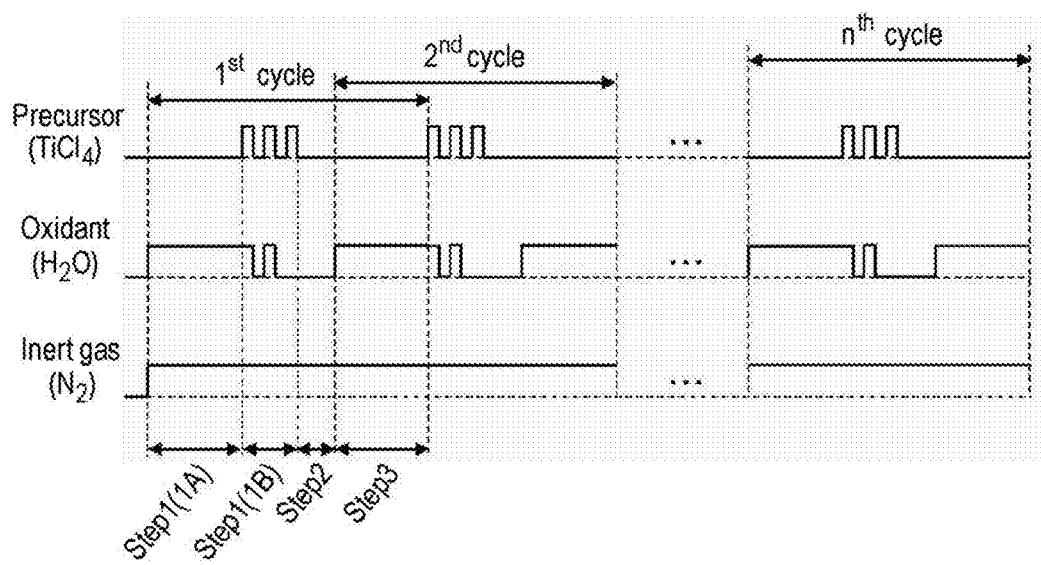
FIG. 9 is a view illustrating modification 7 of the gas supply timings in the film forming sequence according to one embodiment of the present disclosure.

For example, as illustrated in FIG. 9, in step 1B of modification 2, the supply of the $H_2O$ gas may be stopped earlier than the stop of the supply of the $TiCl_4$ gas. That is to say, in step 1B, each of the supply of the $TiCl_4$ gas and the supply of the $H_2O$ gas may be intermittently performed multiple times and the supply of the $H_2O$ gas may be stopped earlier than the stop of the supply of the $TiCl_4$ gas. Except for the aforementioned points, processing procedures and processing conditions of this modification are the same as those of the film forming sequence illustrated in FIG. 4.

Modification 8

For example, in step 1B of modification 2, the supply of the $TiCl_4$ gas may be stopped earlier than the stop of the supply of the $H_2O$ gas. That is to say, in step 1B, each of the supply of the $TiCl_4$ gas and the supply of the $H_2O$ gas may be intermittently performed multiple times and the supply of the $TiCl_4$ gas may be stopped earlier than the stop of the supply of the $H_2O$ gas. Except the aforementioned points, processing procedures and processing conditions of this modification are the same as those of the film forming sequence illustrated in FIG. 4.

Even in these modifications, the effects similar to the effects of the film forming sequence illustrated in FIG. 4 may be achieved.

Furthermore, in modifications 1, 2 and 5 to 8 in which the supply of the TiCl$_4$ gas or the supply of the H$_2$O gas is intermittently performed, it is possible to further improve the thickness controllability or the step coverage of the TiO layer formed per one cycle, namely the finally-formed TiO film.

Furthermore, in modifications 3, 5 and 7 in which the supply of the H$_2$O gas is stopped earlier than the stop of the supply of the TiCl$_4$ gas, by continuously supplying the TiCl$_4$ gas even after the stop of the supply of the H$_2$O gas, it is possible to cause the H$_2$O gas remaining within the process chamber 201 after the stop of the supply of the H$_2$O gas to sufficiently react with the TiCl$_4$ gas. As a result, at the end of step 1B, it is possible to make the amount of the H$_2$O gas remaining in an unreacted state smaller than the amount of the H$_2$O gas available when the supply of the H$_2$O gas and the supply of the TiCl$_4$ gas are stopped simultaneously. Thus, it is possible to restrain the H$_2$O gas remaining within the process chamber 201 from affecting the thickness or the quality of the TiO layer, namely the finally-formed TiO film.

Furthermore, in modifications 4, 6 and 8 in which the supply of the TiCl$_4$ gas is stopped earlier than the stop of the supply of the H$_2$O gas, by continuously supplying the H$_2$O gas even after the stop of the supply of the TiCl$_4$ gas, it is possible to cause the TiCl$_4$ gas remaining within the process chamber 201 after the stop of the supply of the TiCl$_4$ gas to sufficiently react with the H$_2$O gas. As a result, at the end of step 1B, it is possible to make the amount of the TiCl$_4$ gas remaining in an unreacted state smaller than the amount of the TiCl$_4$ gas available when the supply of the H$_2$O gas and the supply of the TiCl$_4$ gas are stopped simultaneously. Thus, it is possible to restrain the TiCl$_4$ gas remaining within the process chamber 201 from affecting the thickness or the quality of the TiO layer, namely the finally-formed TiO film.

Other Embodiments of the Present Disclosure

While one embodiment of the present disclosure has been specifically described above, the present disclosure is not limited to the aforementioned embodiment but may be differently modified without departing from the spirit of the present disclosure.

In the aforementioned embodiment, there has been described an example in which the TiO$_2$ film whose composition ratio is a stoichiometric composition (Ti/O=½) is formed. The present disclosure is not limited to this aspect. It may be possible to form a TiO$_x$ film whose composition ratio differs from a stoichiometric composition.

For example, in step 1B, by making the partial pressure of the H$_2$O gas smaller (lower) than the partial pressure of the H$_2$O gas available in the case of forming a TiO$_2$ film having a stoichiometric composition, or by making the supply flow rate of the H$_2$O gas smaller (lower) than the supply flow rate of the H$_2$O gas available in the case of forming a TiO$_2$ film having a stoichiometric composition, it is possible to form a TiO$_x$ film which is Ti-richer (O-poorer) than the TiO$_2$ film having a stoichiometric composition.

Furthermore, for example, in step 1B, by making the partial pressure of the TiCl$_4$ gas larger (higher) than the partial pressure of the TiCl$_4$ gas available in the case of forming a TiO$_2$ film having a stoichiometric composition, or by making the supply flow rate of the TiCl$_4$ gas larger (higher) than the supply flow rate of the TiCl$_4$ gas available in the case of forming a TiO$_2$ film having a stoichiometric composition, it is possible to form a TiO$_x$ film which is Ti-richer (O-poorer) than the TiO$_2$ film having a stoichiometric composition.

In the embodiment described above, there has been described an example in which step 1A in the m+1$^{th}$ cycle is implemented during the implementation time period of step 3 in the m$^{th}$ cycle or an example in which step 3 in the m$^{th}$ cycle is implemented during the implementation time period of step 1A in the m+1$^{th}$ cycle, for example, an example in which step 3 in the m$^{th}$ cycle and step 1A in the m+1$^{th}$ cycle are implemented simultaneously. However, the present disclosure is not limited to the aforementioned embodiment. For example, step 3 in the m$^{th}$ cycle and step 1A in the m+1$^{th}$ cycle may not be simultaneously implemented but may be successively (non-simultaneously) implemented. Even in this case, the same effects as those of the aforementioned embodiment can be achieved. In addition, processing procedures and processing conditions may be the same as, for example, the processing procedures and the processing conditions of the aforementioned embodiment.

Furthermore, the film forming sequence according to this embodiment may be regarded as a film forming sequence which includes: step A of supplying in advance the H$_2$O gas to the wafer 200 in the process chamber 201; and step B of forming a TiO film on the wafer 200 by performing a cycle a predetermined number of times, the cycle including a step B$_1$ of simultaneously supplying the H$_2$O gas and the TiCl$_4$ gas to the wafer 200 in the process chamber 201, step B$_2$ of stopping the supply of the H$_2$O gas and the TiCl$_4$ gas to the wafer 200 in the process chamber 201 and purging the interior of the process chamber 201 and step B$_3$ of supplying the H$_2$O gas to the wafer 200 in the purged process chamber 201.

In this case, step A and step B are continuously implemented without having to purge the interior of the process chamber 201 between steps A and B. Furthermore, step B$_3$ in the m$^{th}$ cycle (where m is an integer of one or more) and step B$_1$ in the m+1$^{th}$ cycle are continuously implemented without having to purge the interior of the process chamber 201 between steps B$_3$ and B$_1$.

Even in this case, the same effects as those of the aforementioned embodiment may be achieved. In addition, processing procedures and the processing conditions may be the same as, for example, the processing procedures and the processing conditions of the aforementioned embodiment.

In the aforementioned embodiment, there has been described an example in which a film containing Ti as a transition metal element is formed. The present disclosure is not limited to the embodiment described above but may be applied to a case where a metal-based oxide film containing a transition metal element such as zirconium (Zr), hafnium (Hf), tantalum (Ta), niobium (Nb), molybdenum (Mo), tungsten (W) or the like or a typical metal element such as aluminum (Al) or the like is formed. That is to say, the present disclosure may be applied to a case where a metal-based oxide film such as, e.g., a ZrO film, an HfO film, a TaO film, an NbO film, an MoO film, a WO film, an AlO film or the like, is formed. In this case, a precursor containing a metal element such as Zr, Hf, Ta, Nb, Mo, W, Al or the like may be used in place of the Ti-containing precursor used in the aforementioned embodiment. Film formation may be performed by the same sequence as those of the embodiment and modifications described above.

In the case of forming a Zr-based oxide film, as a precursor containing Zr, it may be possible to use, for example, a precursor containing Zr and a halogen element. As the precursor containing Zr and a halogen element, it may be possible to use, for example, a precursor containing Zr and a chloro group, such as zirconium tetrachloride (ZrCl$_4$) or the like, or a precursor containing Zr and a fluoro group, such as zirconium tetrafluoride ($ZrF_4$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

In the case of forming an Hf-based oxide film, as a precursor containing Hf, it may be possible to use, for example, a precursor containing Hf and a halogen element. As the precursor containing Hf and a halogen element, it may be possible to use, for example, a precursor containing Hf and a chloro group, such as hafnium tetrachloride ($HfCl_4$) or the like, or a precursor containing Hf and a fluoro group, such as hafnium tetrafluoride ($HfF_4$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

In the case of forming a Ta-based oxide film, as a precursor containing Ta, it may be possible to use, for example, a precursor containing Ta and a halogen element. As the precursor containing Ta and a halogen element, it may be possible to use, for example, a precursor containing Ta and a chloro group, such as tantalum pentachloride ($TaCl_5$) or the like, or a precursor containing Ta and a fluoro group, such as tantalum pentafluoride ($TaF_5$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

In the case of forming an Nb-based oxide film, as a precursor containing Nb, it may be possible to use, for example, a precursor containing Nb and a halogen element. As the precursor containing Nb and a halogen element, it may be possible to use, for example, a precursor containing Nb and a chloro group, such as niobium pentachloride ($NbCl_5$) or the like, or a precursor containing Nb and a fluoro group, such as niobium pentafluoride ($NbF_5$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

In the case of forming an Mo-based oxide film, as a precursor containing Mo, it may be possible to use, for example, a precursor containing Mo and a halogen element. As the precursor containing Mo and a halogen element, it may be possible to use, for example, a precursor containing Mo and a chloro group, such as molybdenum pentachloride ($MoCl_5$) or the like, or a precursor containing Mo and a fluoro group, such as molybdenum pentafluoride ($MoF_5$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

In the case of forming a W-based oxide film, as a precursor containing W, it may be possible to use, for example, a precursor containing W and a halogen element. As the precursor containing W and a halogen element, it may be possible to use, for example, a precursor containing W and a chloro group, such as tungsten hexachloride ($WCl_6$) or the like, or a precursor containing W and a fluoro group, such as tungsten hexafluoride ($WF_6$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

In the case of forming an Al-based oxide film, as a precursor containing Al, it may be possible to use, for example, a precursor containing Al and a halogen element. As the precursor containing Al and a halogen element, it may be possible to use, for example, a precursor containing Al and a chloro group, such as aluminum trichloride ($AlCl_3$) or the like, or a precursor containing Al and a fluoro group, such as aluminum trifluoride ($AlF_3$) or the like. As the oxidant and the purge gas, it may be possible to use the same oxidant and purge gas as used in the aforementioned embodiment. Processing conditions applied at this time may be the same as, for example, the processing conditions applied in the aforementioned embodiment.

As described above, the present disclosure may be applied to not only the formation of a TiO film but also the formation of an oxide film containing a transition metal element other than Ti or an oxide film containing a typical metal element. Even in this case, the effects similar to the effects of the aforementioned embodiment may be achieved.

Process recipes (programs describing processing procedures and processing conditions of a film-forming process, gas supply patterns, processing conditions such as a film forming temperature or an internal pressure of the process chamber, etc.) used in the film-forming process of various kinds of thin films may be prepared individually (in a plural number) according to the contents of the film-forming process (the kind, composition ratio, quality and thickness of a thin film as formed). When starting a substrate process, a proper recipe may be appropriately selected from the plurality of recipes according to the contents of the substrate process. Specifically, the plurality of recipes prepared individually according to the contents of the substrate processing may be pre-stored (installed) in the memory device 121c of the substrate processing apparatus via a telecommunication line or a recording medium (the external memory device 123) which records the recipes. At the start of the substrate process, the CPU 121a of the substrate processing apparatus may appropriately select a proper recipe from the plurality of recipes stored in the memory device 121c according to the contents of the substrate process. This configuration enables a single substrate processing apparatus to form thin films of different kinds, composition ratios, qualities and thicknesses for a general purpose and with enhanced reproducibility. In addition, this configuration makes it possible to reduce an operator's operation burden (e.g., a burden borne by an operator when inputting processing procedures and processing conditions) and to quickly start the substrate process while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be applied to, for example, a case where thin films are formed using a single-substrate-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be applied to a case where thin films are formed using a substrate processing apparatus provided with a cold-wall-type processing furnace. Even in these cases, processing procedures and the processing conditions may be the same as, for example, the processing procedures and processing conditions of the aforementioned embodiment.

Figure 14:
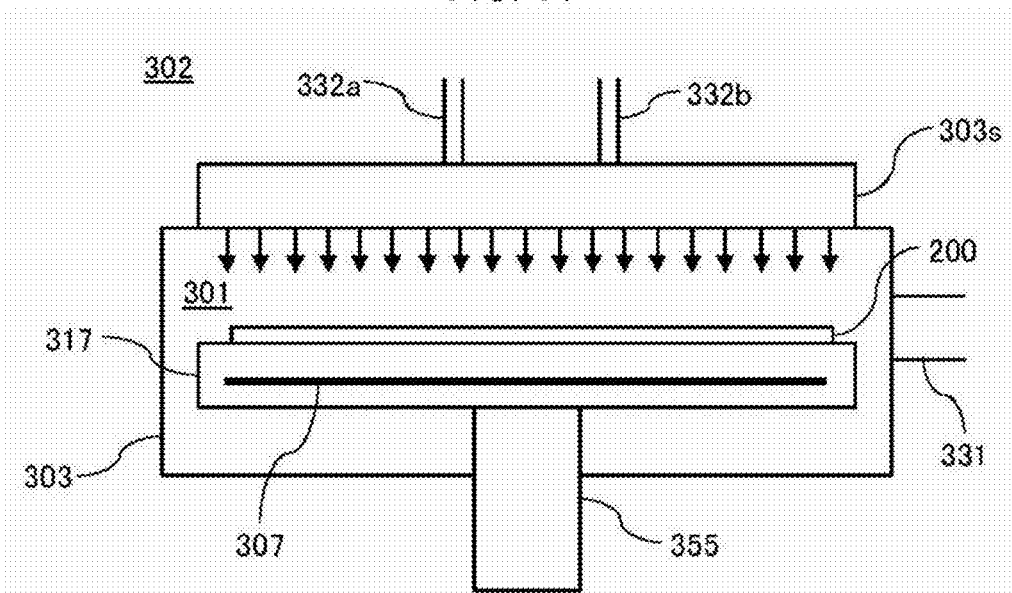
FIG. 14 is a schematic configuration view of a processing furnace of a substrate processing apparatus used in another embodiment of the present disclosure, in which a portion of the processing furnace is shown in a vertical cross section.

The present disclosure may be applied to, for example, a case where a film is formed using a substrate processing apparatus provided with a processing furnace 302 illustrated in FIG. 14. The processing furnace 302 includes a process vessel 303 which defines a process chamber 301, a shower head 303s configured to supply gases into the process chamber 301 in a shower-like manner, a support table 317 configured to horizontally support one or more wafers 200, a rotary shaft 355 configured to support the support table 317 from below, and a heater 307 installed in the support table 317. A gas supply port 332a through which the aforementioned precursor is supplied and a gas supply port 332b through which the aforementioned oxidant is supplied, are connected to inlets (gas introduction holes) of the shower head 303s. A precursor supply system similar to the precursor supply system of the aforementioned embodiment is connected to the gas supply port 332a. An oxidant supply system similar to the oxidant supply system of the aforementioned embodiment is connected to the gas supply port 332b. A gas distribution plate configured to supply gases into the process chamber 301 in a shower-like manner is installed in outlets (gas discharge holes) of the shower head 303s. An exhaust port 331 through which the interior of the process chamber 301 is evacuated, is installed in the process vessel 303. An exhaust system similar to the exhaust system of the aforementioned embodiment is connected to the exhaust port 331.

Figure 15:
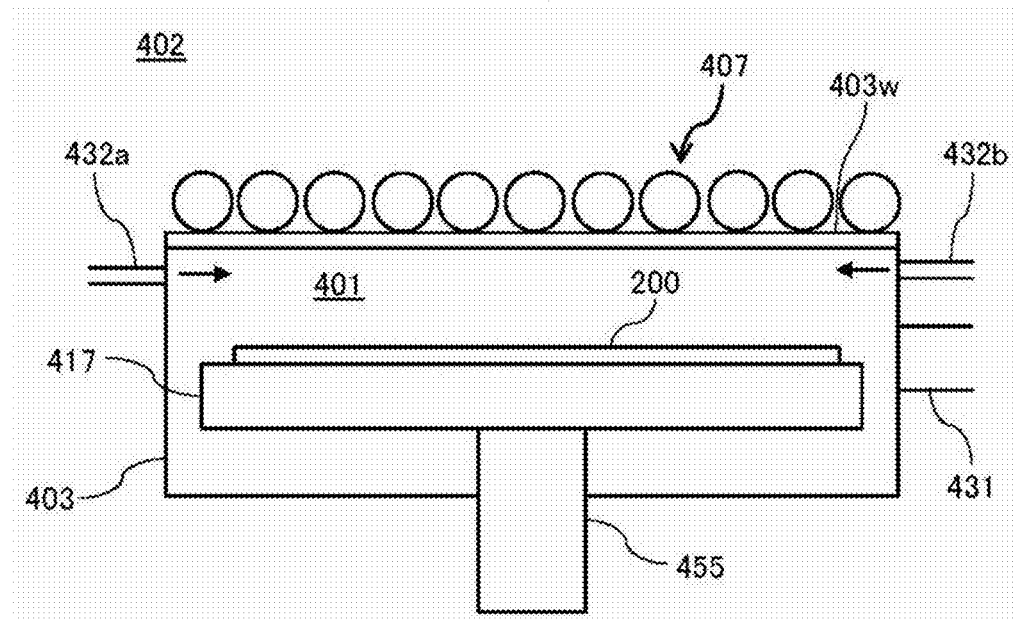
FIG. 15 is a schematic configuration view of a processing furnace of a substrate processing apparatus used in a further embodiment of the present disclosure, in which a portion of the processing furnace is shown in a vertical cross section.

In addition, the present disclosure may be applied to, e.g., a case where a film is formed using a substrate processing apparatus provided with a processing furnace 402 illustrated in FIG. 15. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407 therethrough. A gas supply port 432a through which the aforementioned precursor is supplied and a gas supply port 432b through which the aforementioned oxidant is supplied, are connected to the process vessel 403. A precursor supply system similar to the precursor supply system of the aforementioned embodiment is connected to the gas supply port 432a. An oxidant supply system similar to the oxidant supply system of the aforementioned embodiment is connected to the gas supply port 432b. An exhaust port 431 through which the interior of the process chamber 401 is evacuated, is installed in the process vessel 403. An exhaust system similar to the exhaust system of the aforementioned embodiment is connected to the exhaust port 431.

Even in the case of using these substrate processing apparatuses, a film forming process may be performed according to the sequences and processing conditions similar to those of the embodiments and modifications described above.

The embodiments and modifications described above may be appropriately combined with one another. In addition, processing conditions applied at this time may be similar to, for example, the processing conditions of the embodiments described above.

EXAMPLES

Example 1

Samples A1 to A4 were produced by forming a TiO film on a wafer through the use of the substrate processing apparatus according to the aforementioned embodiment. In producing these samples, a $TiCl_4$ gas was used as a precursor, a $H_2O$ gas was used as an oxidant, and an $N_2$ gas was used as a purge gas. When producing sample A1, a TiO film was formed by bypassing step 2 of the film forming sequence illustrated in FIG. 4 and continuously implementing step 1B and step 3. When producing samples A2 to A4, a TiO film was formed according to the film forming sequence illustrated in FIG. 4. At this time, the implementation time period (purge time period) of step 2 for each sample was set at a time period which falls within the following condition range. Other processing conditions were set at conditions which fall within the condition range described in the aforementioned embodiment.

Sample A1: the purge time period of step 2 is 0 second (the purge is not performed).

Sample A2: the purge time period of step 2 is 10 to 20 seconds.

Sample A3: the purge time period of step 2 is 30 to 40 seconds.

Sample A4: the purge time period of step 2 is 50 to 60 seconds.

Then, the in-plane film thickness uniformity ("Uniformity") and the film thickness ("Thickness") of the TiO films of samples A1 to A4 were evaluated. The right vertical axis in FIG. 10 indicates the in-plane film thickness uniformity (±%) of the TiO film and the left vertical axis in FIG. 10 indicates the average film thickness (A) within the wafer plane as the film thickness of the TiO film. In this regard, the in-plane film thickness uniformity (±%) is a value defined by {(the film thickness maximum value within the wafer plane—the film thickness minimum value within the wafer plane)/(2×the film thickness average value within the wafer plane)}×100. As the value becomes smaller, the film thickness within the wafer plane grows uniform. In the evaluation illustrated in FIG. 10, the film thickness of the TiO film was measured at 49 points within the wafer plane. The in-plane film thickness uniformity and the average film thickness were calculated based on the measured values. The horizontal axis in FIG. 10 indicates the purge time period of step 2 in terms of an arbitrary unit (a.u.). If the value in the horizontal axis is 0, it means that the purge is not performed. Symbol □ in FIG. 10 denotes the in-plane film thickness uniformity of the TiO film. Symbol O in FIG. 10 denotes the film thickness of the TiO film.

Figure 10:
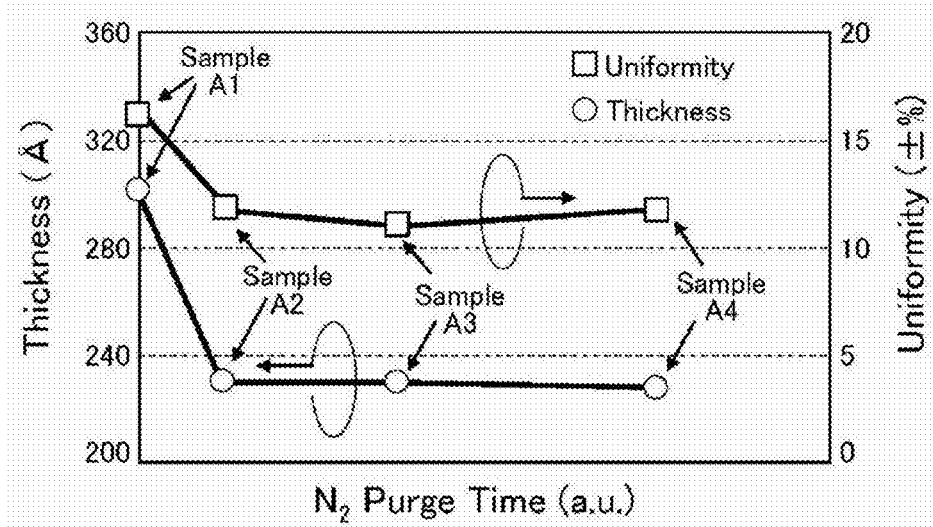
FIG. 10 is a view illustrating evaluation results of a thickness and an in-plane thickness uniformity of a TiO film in example 1.

According to FIG. 10, it can be noted that the TiO films of samples A2 to A4 are more uniform in the in-plane film thickness of the wafer than the TiO film of sample A1. That is to say, it can be seen that the in-plane film thickness uniformity of the TiO film is improved by implementing step 2 between step 1B and step 3. Presumably, this is because, by implementing step 2, it is possible to prevent the film thickness of the TiO film from being affected by the TiCl$_4$ gas, the reaction intermediate or the reaction byproduct separated from the inner wall of the reaction tube or the like. Furthermore, according to FIG. 10, it can be noted that the TiO films of samples A2 to A4 are smaller in the film thickness than the TiO film of sample A1. Presumably, this is because, by implementing step 2, it is possible to prevent an undesired (unnecessary) gas phase reaction from being generated by the TiCl$_4$ gas, the reaction intermediate or the reaction byproduct remaining within the process chamber. Moreover, according to FIG. 10, it can be noted that if the purge time period of step 2 is set at 10 to 20 seconds, the effect of improving the in-plane film thickness uniformity of the TiO film becomes substantially equal to the effect available when the purge time period is set at 30 seconds or more. That is to say, it can be noted that if the purge time period of step 2 is set at 10 to 20 seconds, the aforementioned effect achieved by implementing step 2 is saturated.

Example 2

Samples B1 to B3 were produced by forming a TiO film on a wafer according to the film forming sequence illustrated in FIG. 4 through the use of the substrate processing apparatus of the aforementioned embodiment. In producing these samples, a TiCl$_4$ gas was used as a precursor, a H$_2$O gas was used as an oxidant, and an N$_2$ gas was used as a purge gas. When producing samples B1 to B3, the temperature of the wafer (the film forming temperature) was set at a predetermined temperature which falls within the following condition range. Other processing conditions were set at conditions which fall within the condition range described in the aforementioned embodiment.

Sample B1: the temperature of the wafer is 100 degrees C. or more and less than 200 degrees C.

Sample B2: the temperature of the wafer is 200 degrees C. or more and less than 300 degrees C.

Sample B3: the temperature of the wafer is 300 degrees C. or more and less than 400 degrees C.

Then, a surface roughness (RMS), a growth rate and a film density of the TiO films of samples B1 to B3 were evaluated. The vertical axis in FIG. 11 indicates the surface roughness (nm), the growth rate (Å/min) and the film density (g/cm$^3$) of the TiO films of samples B1 to B3. As the value of the surface roughness becomes smaller, the surface roughness grows better (the surface grows smoother). The horizontal axis in FIG. 11 indicates the film forming temperature in terms of an arbitrary unit (a.u.). Symbol □ in FIG. 11 indicates the surface roughness, symbol O in FIG. 11 indicates the growth rate, and symbol Δ in FIG. 11 indicates the film density. FIG. 12 shows atomic force microscope photographs of the surfaces of the TiO films in samples B1 to B3.

Figure 11:
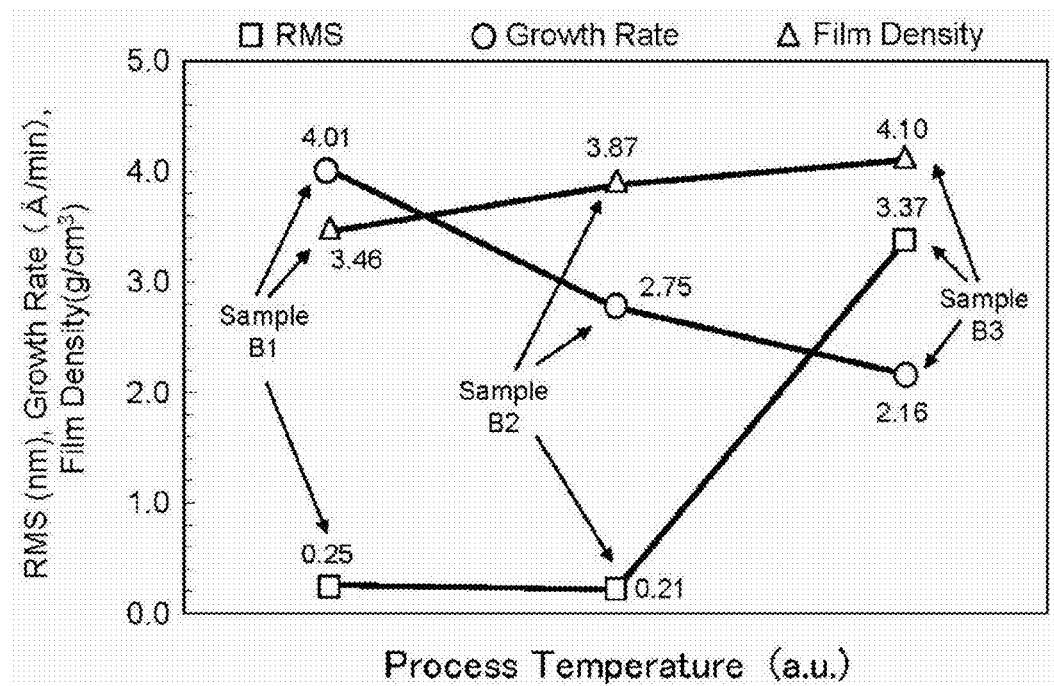
FIG. 11 is a view illustrating evaluation results of a surface roughness, a deposition rate and a density of a TiO film in example 2.
Figure 12:
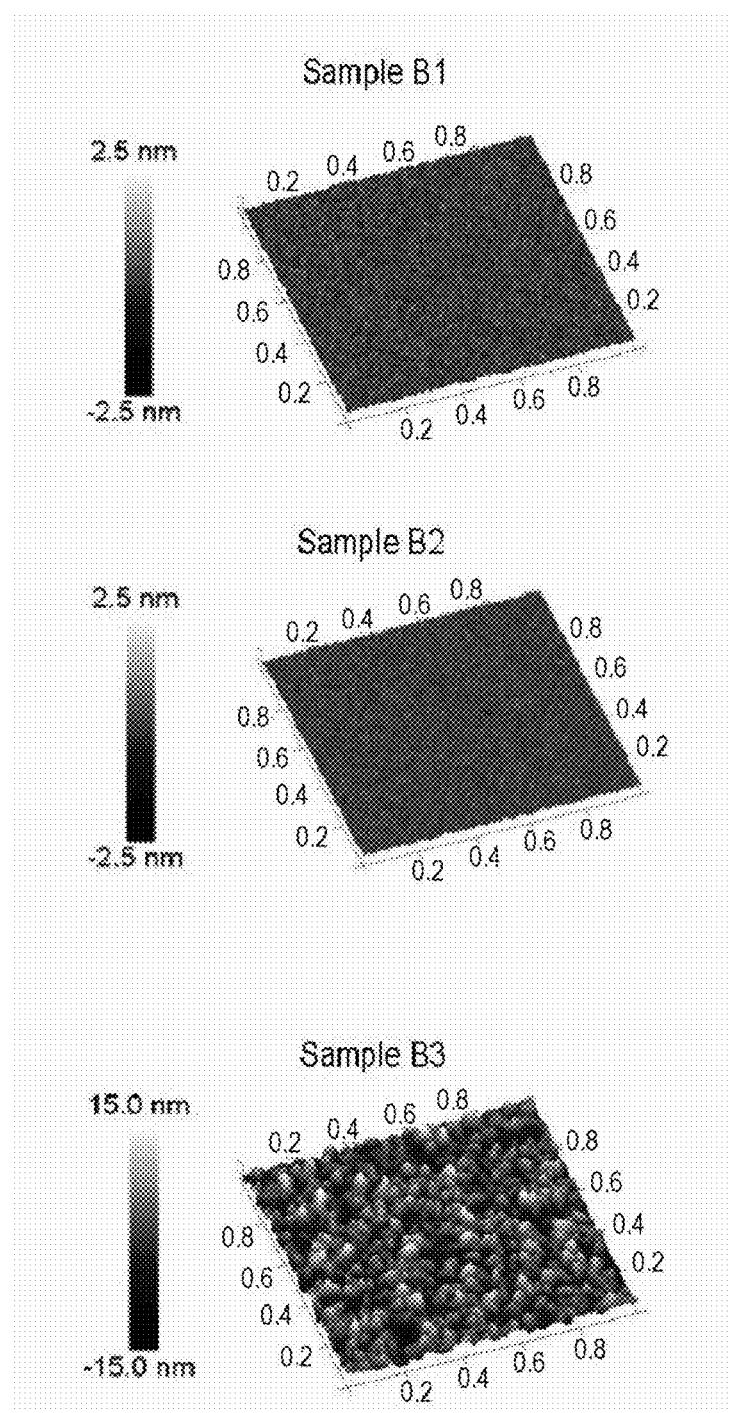
FIG. 12 is a view illustrating micrographs of a surface of a TiO film in example 2.

According to FIGS. 11 and 12, it can be noted that the RMS of the TiO films of samples B1 and B2 is 1/10 or less of the RMS of the TiO film of sample B3 and further that the TiO films of samples B1 and B2 is better in the surface roughness (smoother) than the TiO film of sample B3. Presumably, this is because, by performing the film-forming process under the wafer temperature of less than 300 degrees C. as in samples B1 and B2, it was possible to suppress the crystallization of TiO deposited on the wafer and to make the surface of the TiO film smooth. On the other hand, if the film-forming process is performed under the wafer temperature of 300 degrees C. or more as in sample B3, the TiO deposited on the wafer is crystallized and the surface of the TiO film is roughened. Furthermore, according to FIG. 11, it can be noted that the growth rate grows higher in the order of samples B1, B2 and B3 (the growth rate of sample B1 is about twice as high as the growth rate of sample B3). Presumably, this is because, by setting the wafer temperature at 300 degrees C. or less, ultimately 200 degrees C. or less, the efficiency of deposition of TiO onto the wafer is improved. Moreover, according to FIG. 11, it can be noted that all the TiO films of samples B1 to B3 have a sufficiently-high film density. Presumably, this is because, by implementing step 3, the TiO layer formed in step 1B can be modified into a dense layer having a high density.

Furthermore, the Cl concentrations in the TiO films of samples B1 to B3 were evaluated. The vertical axis in FIG. 13 indicates an atomic concentration (atomic %) of O, Ti and Cl in the TiO films of samples B1 to B3 measured by an XPS. The horizontal axis in FIG. 13 indicates the kind of elements (O, Ti and Cl) contained in the TiO films.

Figure 13:
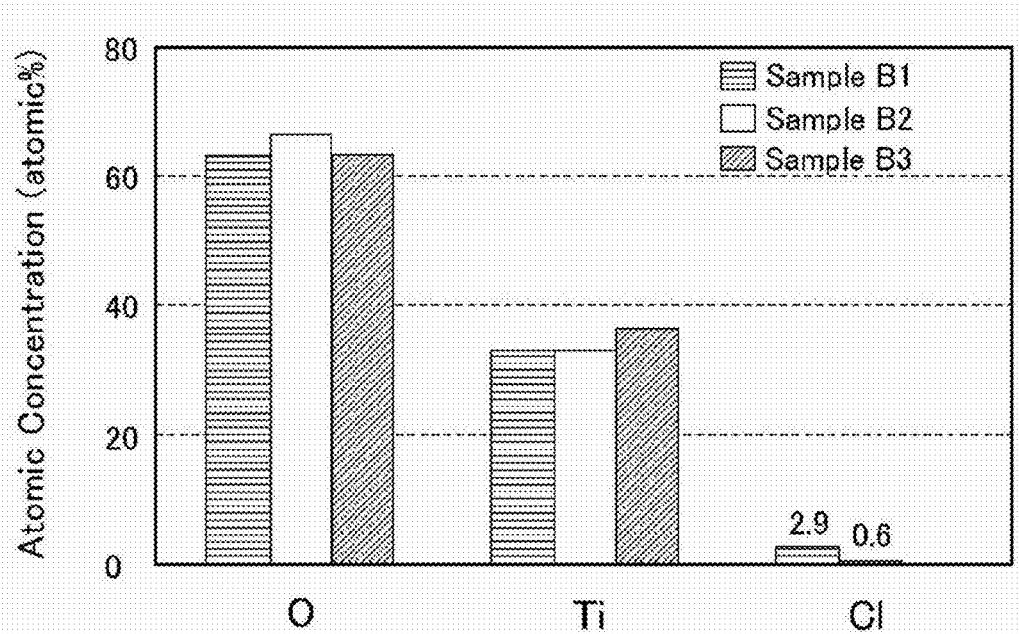
FIG. 13 is a view illustrating evaluation results of composition of a TiO film in example 2.

As illustrated in FIG. 13, the Cl concentrations in the TiO films of samples B1 and B2 were 2.9 atomic % and 0.6 atomic % in sequence. Furthermore, the Cl concentrations in the TiO film of sample B3 was very small and, therefore, could not be measured. From this result, it can be noted that in any of samples B1 to B3, it is possible to sufficiently reduce the Cl concentration in the TiO film. Presumably, this is because, by implementing step 3, it is possible to desorb Cl from the TiO layer formed in step 1B and to modify the TiO layer formed in step 1B into a layer having a low impurity concentration. Since the Cl concentration grows lower in the order of samples B3, B2 and B1 (the Cl concentration of sample B3 is lowest and the Cl concentration of sample B1 is highest), it can be noted that, by increasing the temperature of the wafer, the modification efficiency in step 3 is improved.

Preferred Aspect of the Present Disclosure

Hereinafter, preferred aspects of the present disclosure will be described as supplementary notes.

Supplementary Note 1

According to one aspect of the present disclosure, there is provided a method of manufacturing a semiconductor device and a substrate processing method, including forming an oxide film on a substrate by performing a cycle a predetermined number of times, the cycle including:
continuously performing supplying in advance an oxidant to the substrate in a process chamber and simultaneously supplying the oxidant and a precursor to the substrate in the process chamber, without having to purge an interior of the process chamber between the act of supplying in advance an oxidant and the act of simultaneously supplying the oxidant and a precursor;
stopping the supply of the oxidant and the precursor to the substrate in the process chamber and purging the interior of the process chamber; and
supplying the oxidant to the substrate in the purged process chamber.

Supplementary Note 2

In the method of Supplementary Note 1, in the act of continuously performing the act of supplying in advance the oxidant and the act of simultaneously supplying the oxidant and the precursor, the supply of the oxidant may not be stopped and may be maintained.

Supplementary Note 3

In the method of Supplementary Note 1 or 2, an implementation time period of the act of supplying in advance the oxidant may be set longer than an implementation time period of the act of simultaneously supplying the oxidant and the precursor.

Supplementary Note 4

In the method of any one of Supplementary Notes 1 to 3, an implementation time period of the act of supplying the oxidant after the purging may be set longer than an implementation time period of the act of simultaneously supplying the oxidant and the precursor.

Supplementary Note 5

In the method of any one of Supplementary Notes 1 to 4, when stopping the supply of the oxidant and the precursor, the supply of the oxidant and the supply of the precursor may be simultaneously stopped.

Supplementary Note 6

In the method of any one of Supplementary Notes 1 to 5, when stopping the supply of the oxidant and the precursor, the supply of the oxidant may be stopped earlier than the stop of the supply of the precursor.

Supplementary Note 7

In the method of any one of Supplementary Notes 1 to 6, the act of supplying the oxidant after the purging in an $m^{th}$ cycle (where m is an integer of one or more) and the act of supplying in advance the oxidant in an $m+1^t$ cycle may be implemented simultaneously.

Supplementary Note 8

In the method of any one of Supplementary Notes 1 to 6, during an implementation time period of the act of supplying the oxidant after the purging in an $m^{th}$ cycle (where m is an integer of one or more), the act of supplying in advance the oxidant in an $m+1^{th}$ cycle may be implemented.

Supplementary Note 9

In the method of any one of Supplementary Notes 1 to 6, during an implementation time period of the act of supplying in advance the oxidant in an $m+1^{th}$ cycle (where m is an integer of one or more), the act of supplying the oxidant after the purging in an $m^{th}$ cycle may be implemented.

Supplementary Note 10

In the method of any one of Supplementary Notes 1 to 9, the precursor may contain an halogen group.

Supplementary Note 11

In the method of any one of Supplementary Notes 1 to 10, the precursor may contain a metal element and a halogen group, and the oxide film may contain the metal element.

Supplementary Note 12

In the method of Supplementary Note 10 or 11, the halogen group may include a chloro group (Cl), a fluoro group (F), a bromo group (Br) or an iodine group (I).

Supplementary Note 13

In the method of Supplementary Note 10 or 11, the halogen group may include a chloro group (Cl).

Supplementary Note 14

In the method of Supplementary Note 11, the metal element may include a transition metal (Ti, Zr, Hf, Ta, Nb, Mo, W, etc.) or a typical metal (Al, etc.).

Supplementary Note 15

In the method of Supplementary Note 11, the metal element may include a transition metal (Ti, Zr, Hf, Ta, Nb, Mo, W, etc.).

Supplementary Note 16

In the method of any one of Supplementary Notes 1 to 15, the precursor may include a metal halide.

Supplementary Note 17

In the method of any one of Supplementary Notes 1 to 16, the precursor may include a titanium halide ($TiCl_4$).

Supplementary Note 18

In the method of any one of Supplementary Notes 1 to 17, the oxidant may include $H_2O$ or $H_2O_2$.

Supplementary Note 19

According to another aspect of the present disclosure, there is provided a substrate processing apparatus, including:
a process chamber configured to accommodate a substrate;
a precursor supply system configured to supply a precursor into the process chamber;
an oxidant supply system configured to supply an oxidant into the process chamber;
a purge gas supply system configured to supply a purge gas into the process chamber; and
a control part configured to control the precursor supply system, the oxidant supply system and the purge gas supply system so as to perform forming an oxide film on the substrate by performing a cycle a predetermined number of times, the cycle including: continuously performing supplying in advance the oxidant to the substrate in the process chamber and simultaneously supplying the oxidant and the precursor to the substrate in the process chamber, without having to purge an interior of the process chamber between the act of supplying in advance the oxidant and the act of simultaneously supplying the oxidant and the precursor; stopping the supply of the oxidant and the precursor to the substrate in the process chamber and supplying a purge gas into the process chamber to purge the interior of the process chamber; and supplying the oxidant to the substrate in the purged process chamber.

Supplementary Note 20

According to a further aspect of the present disclosure, there is provided a program and a non-transitory computer-readable recording medium storing the program, wherein the program causes a computer to perform forming an oxide film on a substrate by performing a cycle a predetermined number of times, the cycle including:
- continuously performing supplying in advance an oxidant to the substrate in a process chamber and simultaneously supplying the oxidant and a precursor to the substrate in the process chamber, without having to purge an interior of the process chamber between the act of supplying in advance the oxidant and the act of simultaneously supplying the oxidant and the precursor;
- stopping the supply of the oxidant and the precursor to the substrate in the process chamber and purging the interior of the process chamber; and
- supplying the oxidant to the substrate in the purged process chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming an oxide film containing a transition metal element selected from Ti, Zr, Hf, Ta, Nb, Mo or W on a substrate by performing a cycle a predetermined number of times, the cycle including:
    continuously performing supplying in advance an oxidant to the substrate in a process chamber, and causing a gas phase reaction between the oxidant and a precursor containing the transition metal element and a halogen element and a surface reaction between an adsorption layer of the oxidant formed on the substrate and the precursor while simultaneously supplying the oxidant and the precursor to the substrate in the process chamber to form an oxide layer containing the transition metal element on the substrate, without having to purge an interior of the process chamber between the act of supplying in advance the oxidant and the act of simultaneously supplying the oxidant and the precursor;
    stopping the supply of the oxidant and the precursor to the substrate in the process chamber and purging the interior of the process chamber; and
    supplying the oxidant to the substrate in the purged process chamber,
    wherein an adsorption layer of the oxidant is formed by performing the act of supplying in advance the oxidant to the substrate in the process chamber, and
    wherein an implementation time period of the act of supplying in advance the oxidant is set longer than an implementation time period of the act of simultaneously supplying the oxidant and the precursor such that the adsorption layer of the oxidant formed on the substrate become a continuous layer.

2. The method of claim 1, wherein in the act of continuously performing the act of supplying in advance the oxidant and the act of simultaneously supplying the oxidant and the precursor, the supply of the oxidant is not stopped and is maintained.

3. The method of claim 1, wherein an implementation time period of the act of supplying the oxidant after the purging is set longer than an implementation time period of the act of simultaneously supplying the oxidant and the precursor.

4. The method of claim 1, wherein when stopping the supply of the oxidant and the precursor, the supply of the oxidant and the supply of the precursor are simultaneously stopped.

5. The method of claim 1, wherein when stopping the supply of the oxidant and the precursor, the supply of the oxidant is stopped earlier than the stop of the supply of the precursor.

6. The method of claim 1, wherein the act of supplying the oxidant after the purging in an $m^{th}$ cycle (where m is an integer of one or more) and the act of supplying in advance the oxidant in an $m+1^{th}$ cycle are implemented simultaneously.

7. The method of claim 1, wherein during an implementation time period of the act of supplying the oxidant after the purging in an $m^{th}$ cycle (where m is an integer of one or more), the act of supplying in advance the oxidant in an $m+1^{th}$ cycle is implemented.

8. The method of claim 1, wherein during an implementation time period of the act of supplying in advance the oxidant in an $m+1^{th}$ cycle (where m is an integer of one or more), the act of supplying the oxidant after the purging in an $m^{th}$ cycle is implemented.

9. The method of claim 1, wherein the oxidant includes $H_2O$ or $H_2O_2$.

10. The method of claim 1, wherein a temperature of the substrate ranges from room temperature to 200 degrees C. in the act of simultaneously supplying the oxidant and the precursor.

11. The method of claim 1, wherein a temperature of the substrate ranges from room temperature to 100 degrees C. in the act of simultaneously supplying the oxidant and the precursor.

12. A non-transitory computer-readable recording medium storing a program that causes a computer to perform forming an oxide film containing a transition metal element selected from Ti, Zr, Hf, Ta, Nb, Mo or W on a substrate by performing a cycle a predetermined number of times, the cycle including:
    continuously performing supplying in advance an oxidant to the substrate in a process chamber, and causing a gas phase reaction between the oxidant and a precursor containing the transition metal element and a halogen element and a surface reaction between an adsorption layer of the oxidant formed on the substrate and the precursor while simultaneously supplying the oxidant and the precursor to the substrate in the process chamber to form an oxide layer containing the transition metal element on the substrate, without having to purge an interior of the process chamber between the act of supplying in advance the oxidant and the act of simultaneously supplying the oxidant and the precursor;
    stopping the supply of the oxidant and the precursor to the substrate in the process chamber and purging the interior of the process chamber; and supplying the oxidant to the substrate in the purged process chamber, wherein an adsorption layer of the oxidant is formed by performing the act of supplying in advance the oxidant to the substrate in the process chamber, and wherein an implementation time period of the act of supplying in advance the oxidant is set longer than an implementation time period of the act of simultaneously supplying the oxidant and the precursor such that the adsorption layer of the oxidant formed on the substrate become a continuous layer.

\* \* \* \* \*